United States Patent
Kuse et al.

(10) Patent No.: US 10,850,548 B2
(45) Date of Patent: Dec. 1, 2020

(54) LITHOGRAPHIC PRINTING PRECURSOR

(71) Applicant: TORAY INDUSTRIES, INC., Tokyo (JP)

(72) Inventors: Yasunori Kuse, Otsu (JP); Yuki Kase, Otsu (JP); Takejiro Inoue, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 264 days.

(21) Appl. No.: 16/097,495

(22) PCT Filed: May 17, 2017

(86) PCT No.: PCT/JP2017/018475
§ 371 (c)(1),
(2) Date: Oct. 29, 2018

(87) PCT Pub. No.: WO2017/204046
PCT Pub. Date: Nov. 30, 2017

(65) Prior Publication Data
US 2019/0143730 A1  May 16, 2019

(30) Foreign Application Priority Data

May 27, 2016 (JP) ................. 2016-105994
Feb. 24, 2017 (JP) ................. 2017-033906

(51) Int. Cl.
| | | |
|---|---|---|
| *B41N 1/14* | (2006.01) | |
| *G03F 7/11* | (2006.01) | |
| *G03F 7/00* | (2006.01) | |
| *B41N 1/00* | (2006.01) | |
| *B41C 1/10* | (2006.01) | |
| *G03F 7/075* | (2006.01) | |
| *G03F 7/20* | (2006.01) | |
| *G03F 7/26* | (2006.01) | |

(52) U.S. Cl.
CPC ............ *B41N 1/14* (2013.01); *B41C 1/1008* (2013.01); *B41N 1/003* (2013.01); *G03F 7/00* (2013.01); *G03F 7/0758* (2013.01); *G03F 7/11* (2013.01); *G03F 7/20* (2013.01); *G03F 7/26* (2013.01); *B41C 2210/16* (2016.11)

(58) Field of Classification Search
None
See application file for complete search history.

(56) References Cited

U.S. PATENT DOCUMENTS

| | | | |
|---|---|---|---|
| 2011/0300486 A1 | 12/2011 | Iihara et al. | |
| 2013/0273473 A1* | 10/2013 | Iihara | B41C 1/1008 430/270.1 |
| 2017/0232775 A1* | 8/2017 | Kuse | C09D 11/101 101/453 |

FOREIGN PATENT DOCUMENTS

| | | |
|---|---|---|
| JP | 2001-232959 A | 8/2001 |
| JP | 2003-287881 A | 10/2003 |
| JP | 2004-334025 A | 11/2004 |
| JP | 2006-276597 A | 10/2006 |
| JP | 2007-147819 A | 6/2007 |
| JP | 2007-219358 A | 8/2007 |
| WO | WO 2016/076286 A1 | 5/2016 |

OTHER PUBLICATIONS

International Search Report, issued in PCT/JP2017/018475, PCT/ISA/210, dated Jul. 25, 2017.
Written Opinion of the International Searching Authority, issued in PCT/JP2017/018475, PCT/ISA/237, dated Jul. 25, 2017.

* cited by examiner

*Primary Examiner* — Joshua D Zimmerman
(74) *Attorney, Agent, or Firm* — Birch, Stewart, Kolasch & Birch, LLP

(57) ABSTRACT

Provided is a precursor for lithographic printing having excellent printing durability and ink repellency as well as high reproducibility of the high definition images. The precursor for lithographic printing includes, at least a heat sensitive layer and an ink repellent layer wherein the ink repellent layer has an elastic modulus of the plate surface under the surface load of 14000 N/m2 of at least 25 MPa and up to 35 MPa.

20 Claims, No Drawings

LITHOGRAPHIC PRINTING PRECURSOR

TECHNICAL FIELD

The present invention relates to a precursor for lithographic printing.

BACKGROUND ART

Printing methods using lithographic printing plate include wet printing methods wherein a thin water layer is preliminarily formed on the plate surface so that the ink is repelled in the printing and waterless printing methods wherein a silicone rubber thin layer is provided on the plate surface instead of this water thin layer for repelling the ink.

In the wet printing, the ink is blurred on the printing substrate due to emulsification of the ink by the water, and reproduction of a high definition image such as fine lines of up to 10 µm is difficult. On the other hand, high definition images are stably reproduced in theory in the case of the waterless printing since the ink is not emulsified.

In the waterless offset printing, high definition images have been realized by means of reducing the thickness of the silicone rubber used for the ink repellent layer to facilitate breakage of the silicone rubber. This method, however, have so far failed to satisfy the scratch resistance and the printing durability, and also, suffered from significant loss of the ink repellency since the ink repellency is proportional to the silicone rubber thickness.

In view of such situation, there has been a proposal of promoting the silicone rubber breakage by controlling the initial elastic modulus of the silicone rubber (see, for example, Patent Document 1).

Also proposed is improvement of the ink repellency by incorporating a silicone oil in the silicone rubber (see, for example, Patent Document 2).

PRIOR ART DOCUMENTS

Patent Document

Patent Document 1: Japanese Unexamined Patent Publication (Kokai) No. 2007-219358
Patent Document 2: Japanese Unexamined Patent Publication (Kokai) No. 2001-232959

SUMMARY OF THE INVENTION

Problems to be Solved by the Invention

However, the method of controlling the initial elastic modulus of the silicone rubber as disclosed in the Patent Document 1 still required reduction of the silicone rubber thickness, and accordingly, this method failed to realize the practically acceptable scratch resistance, printing durability, and ink repellency.

In the meanwhile, improvement of the scratch resistance has been enabled by the method wherein a silicone oil is introduced in the silicone rubber as disclosed in the Patent Document 2 since reduction in the thickness of the silicone rubber is no longer needed. However, the printing durability was often insufficient.

In view of the situation as described above, there has been a demand for a printing plate which is capable of realizing a high definition image as well as high ink repellency and printing durability without reducing the thickness.

Accordingly, the present invention provides a precursor for lithographic printing having excellent printing durability and ink repellency as well as high reproducibility of high definition images.

Means for Solving the Problems

The precursor for lithographic printing of the present invention has the following constitution, namely, a precursor for lithographic printing comprising at least a heat sensitive layer and an ink repellent layer wherein the ink repellent layer has an elastic modulus of the plate surface under the surface load of 14000 $N/m^2$ of at least 25 MPa and up to 35 MPa.

Advantageous Effects of the Invention

The present invention provides a precursor for lithographic printing having excellent printing durability and ink repellency as well as high reproducibility of the high definition images.

DESCRIPTION OF PREFERRED EMBODIMENTS

The present invention provides a precursor for lithographic printing having excellent reproducibility of high definition images as well as high printing durability and ink repellency by considering the relation of the elastic modulus of the plate surface and the surface roughness with the high precision reproducibility, the relation of the elastic modulus of the plate surface (proportion of the crosslinking agent) with the printing durability, and the relation of the ink repellency and the proportion of the crosslinking agent. The precursor for lithographic printing of the present invention may be used in both the waterless printing and the wet printing, and its use is more suitable for the waterless printing.

Next, the precursor for lithographic printing of the present invention is described.

The precursor for lithographic printing of the present invention is a precursor for lithographic printing comprising at least a heat sensitive layer and an ink repellent layer wherein the ink repellent layer has an elastic modulus of the plate surface under the surface load of 14000 $N/m^2$ of at least 25 MPa and up to 35 MPa.

The "load of 14000 $N/m^2$" corresponds to the load applied to the plate surface during the development. When the elastic modulus under such load is at least 25 MPa, the ink repellent layer is less likely to be elongated, and hence, the ink repellent layer is likely to be fractured to enable the reproduction of images with higher precision. On the other hand, loss of printing durability due to brittle fracture of the ink repellent layer is unlikely to be induced when the elastic modulus of up to 35 MPa.

If necessary, the precursor for lithographic printing of the present invention has a substrate. When it has a substrate, at least a heat sensitive layer and an ink repellent layer are provided on or above the substrate. While the layer disposed near the substrate may be either the heat sensitive layer or the ink repellent layer, the preferred is provision of the layers in the order of the substrate, the heat sensitive layer, and the ink repellent layer.

Exemplary substrates that can be used in the present invention include known papers, metals, glasses, and films which have been used for the substrate in the printing plates and which experience reduced dimensional change in the printing step. Specific examples include papers, papers laminated with a plastic material (polyethylene, polypropylene, polystyrene, or the like), plates of a metal such as aluminum (including aluminum alloys), zinc, or copper, plate of soda-lime glass, quarts, or other glasses, silicon wafers, plastic films such as films of cellulose acetate, polyethylene terephthalate, polyethylene, polyester, polyamide, polyimide, polystyrene, polypropylene, polycarbonate, or polyvinyl acetal, and papers or plastic films having a metal as mentioned above laminated or vapor-deposited thereon. The plastic film may be either transparent or opaque, and the preferred is use of an opaque film in view of the proofing of the plate.

Among these substrates, the most preferred is use of an aluminum plate due to its high dimensional stability in the printing step and inexpensive. Also preferred is use of a polyethylene terephthalate film as a soft substrate for quick printing.

The substrate thickness is not particularly limited, and the thickness corresponding to a press used in the lithographic printing may be selected.

The precursor for lithographic printing of the present invention may have an organic layer, and this organic layer may be disposed on the heat sensitive layer on the side opposite to the ink repellent layer, namely, between the substrate and the heat sensitive layer. The organic layer used in the precursor for lithographic printing of the present invention is required to have the properties capable of providing softness to the precursor for lithographic printing, good adhesion with the substrate or the heat sensitive layer, and high durability to the developer or the solvent used in the printing. An exemplary non-limiting organic layer is the one containing a metal chelate compound disclosed, for example, in Japanese Unexamined Patent Publication (Kokai) No. 2004-199016 and Japanese Unexamined Patent Publication (Kokai) No. 2004-334025.

In the present invention, the organic layer may contain a softener agent such as a polyurethane resin, a natural rubber, or a synthetic rubber for the purpose of providing the softness and controlling the elastic modulus of the plate surface. Of such softener agent, the particularly preferred is a polyurethane resin in view of coating performance and stability of the coating solution.

Content of the polyurethane resin in the organic layer is preferably at least 51% by weight and more preferably at least 55% by weight in view of preventing excessive increase of the elastic modulus of the plate surface by cushion effect and suppressing loss of printing durability by brittle fracture of the ink repellent layer. In the meanwhile, the content in the organic layer is preferably up to 65% by weight and more preferably up to 61% by weight in view of preventing loss of image reproducibility due to excessive decrease in the elastic modulus of the plate surface and suppressing loss of printing durability due to brittleness of the organic layer.

The organic layer may contain an active hydrogen group-containing compound to provide adhesiveness to the substrate or the heat sensitive layer. Exemplary active hydrogen group-containing compounds include hydroxy group-containing compound, amino group-containing compound, carboxyl group-containing compound, and thiol group-containing compound, and the preferred is the hydroxy group-containing compound. In the present invention, the hydroxy group-containing compound used may be either a phenolic hydroxy group-containing compound or an alcoholic hydroxy group-containing compound, or alternatively, an epoxy acrylate, an epoxy methacrylate, a polyvinylbutylal resin, an epoxy resin, or a polymer having the hydroxy group introduced by a known method. Of such active hydrogen group-containing compounds, the particularly preferred is the epoxy resin in view of the adhesion with the substrate.

Content of the epoxy resin in the organic layer is preferably at least 27% by weight and more preferably at least 29% by weight in view of promoting the adhesion with the substrate and improving the printing durability. In the meanwhile, the content in the organic layer is preferably up to 35% by weight and more preferably up to 31% by weight to suppress incorporation of the reaction component which failed to undergo the reaction in the heat sensitive layer and prevent loss of image reproducibility.

In the present invention, the organic layer preferably contains a pigment. By incorporating the pigment, light transmission of the organic layer can be reduced to the level of up to 15% for every wavelength in the range of 400 to 650 nm, and this enables inspection of the plate by mechanical reading. Exemplary preferable pigments include inorganic white pigments such as titanium oxide, zinc white, and lithopone and inorganic yellow pigments such as chrome yellow, cadmium yellow, yellow iron oxide, ocher, and titanium yellow. Of these pigments, the most preferred is titanium oxide because of its high coloring performance. The titanium oxide may also have the particle surface treated with a titanate coupling agent, and the treatment of the titanium oxide particle surface with the titanate coupling agent enables improvement of the dispersibility of the titanium oxide particles, and hence, incorporation of an increased amount of the titanium oxide particles. The coating solution containing the titanium oxide particles will also have improved dispersion stability.

Content of the titanium oxide is preferably at least 2% by volume of the organic layer in view of realizing good covering performance. In the meanwhile, the content of the titanium oxide is preferably up to 30% by volume in view of realizing good coating performance.

Next, the heat sensitive layer preferable for use in the present invention is described.

The heat sensitive layer is preferably the one having the function of converting the laser light used for the drawing to heat (photothermal function) so that the heat generated promotes decomposition of at least the surface of the heat sensitive layer, dissolution in the developer, or loosening of the adhesion with the ink repellent layer. Such heat sensitive layer may contain, for example, the following compositions:

(A) a composition containing a polymer having an active hydrogen, a crosslinking agent, and a photothermal substance.

(B) a composition containing a polymer having an active hydrogen, an organic complex compound, and a photothermal substance.

The heat sensitive layer as described above can be prepared by coating a solution or dispersion containing such composition and drying the coating. The coating may be conducted at room temperature or with heating. When the thus prepared heat sensitive layer is irradiated with a laser beam, the heat generated from the photothermal substance will decompose the crosslink structure constituted by the polymer having an active hydrogen and the crosslinking agent in the case of the composition (A) and the crosslink structure constituted by the polymer having an active hydrogen and the organic complex compound in the case of the composition (B).

Exemplary polymer having an active hydrogen which is preferable for use in the heat sensitive layer of the present invention is a polymer having a structural unit having an active hydrogen. Examples of the structural unit having an active hydrogen include —OH, —SH, —NH$_2$, —NH—, —CO—NH$_2$, —CO—NH—, —OC(=O)—NH—, —NH—CO—NH—, —CO—OH, —CS—OH, —CO—SH, —CS—SH, —SO$_3$H, —PO$_3$H$_2$, —SO$_2$—NH$_2$, —SO$_2$—NH—, and —CO—CH$_2$—CO—.

The polymers having an active hydrogen which can be used in the compositions (A) and (B) includes the following polymers:

a homopolymer or copolymer of a monomer having carboxyl group such as (meth)acrylic acid; a homopolymer or copolymer of a (meth)acrylate ester containing hydroxyl group such as hydroxyethyl (meth)acrylate and 2-hydroxypropyl (meth)acrylate; a homopolymer or copolymer of a N-alkyl(meth) acrylamide or (meth) acrylamide; a homopolymer or copolymer of a reactant of an amine with glycidyl (meth)acrylate or allyl glycidyl; and a homopolymer or copolymer of p-hydroxy styrene or vinyl alcohol; which are a homopolymer or copolymer of an ethylenically unsaturated monomer having an active hydrogen (the monomer component of the copolymer may be other ethylenically unsaturated monomer having an active hydrogen or an ethylenically unsaturated monomer having no active hydrogen).

Examples of the polymer having a structural unit having an active hydrogen also include a polymer having a structural unit having an active hydrogen on its backbone. Exemplary such polymers include a polyurethane, a polyurea, a polyamide, an epoxy resin, a polyalkylene imine, a novolac resin, a resol resin, a cellulose derivative, which may be used in combination of two or more.

Of these, the preferred are polymers having an alcoholic hydroxy group, phenolic hydroxy group, or carboxyl group; the more preferred are polymers having aphenolic hydroxy group (for example, a homopolymer or a copolymer of p-hydroxy styrene, novolac resin, resol resin); and the still more preferred is novolac resin. Exemplary novolac resins include phenol novolac resin and cresol novolac resin.

Content of the polymer having an active hydrogen in the heat sensitive layer is preferably at least 20% by weight and more preferably at least 30% by weight in view of decomposing the heat sensitive layer surface by the heat or increasing solubility of the heat sensitive layer surface to the developer to thereby promote the development. The content is preferably up to 95% by weight and more preferably up to 80% by weight in view of toughness of the heat sensitive layer.

Also preferred is inclusion of a polymer having no active hydrogen which is capable of forming a film (hereinafter referred to as "additional polymer X") in addition to the polymer having an active hydrogen.

Examples of the additional polymer X include a homopolymer or a copolymer of a (meth)acrylate such as polymethyl (meth)acrylate or polybutyl (meth)acrylate; a homopolymer or a copolymer of a styrene monomer such as polystyrene or α-methylstyrene; isoprene, styrene-butadiene, or other synthetic rubber; a homopolymer of a vinyl ester such as polyvinyl acetate and a copolymer such as vinyl acetate-vinyl chloride; a condensation polymer such as polyester and polycarbonate.

Total content of the additional polymer X in the heat sensitive layer is preferably at least 5% by weight and more preferably at least 10% by weight in order to improve coating properties of the solution of the composition for the heat sensitive layer. The total content of the additional polymer X in the total solid content of the heat sensitive layer is also preferably up to 50% by weight and more preferably up to 30% by weight in order to increase precision of the reproduced image.

Exemplary crosslinking agent incorporated in the composition (A) for the heat sensitive layer include a polyfunctional compound having a plurality of functional groups having reactivity with the active hydrogen of the polymer. Examples include polyfunctional isocyanate, polyfunctional blocked isocyanate, polyfunctional epoxy compound, polyfunctional (meth)acrylate compound, polyfunctional aldehyde, polyfunctional mercapto compound, polyfunctional alkoxysilyl compound, polyfunctional amine compound, polyfunctional carboxylic acid, polyfunctional vinyl compound, polyfunctional diazonium salt, polyfunctional azido compound, and hydrazine.

Exemplary organic complex compound incorporated in the composition (B) for the heat sensitive layer include a compound comprising a metal and an organic compound, which functions as a crosslinking agent for the polymer having an active hydrogen. The heat sensitive layer may also have the crosslinking agent of the composition (A) incorporated. Exemplary such organic complex compounds include organic complex salts wherein an organic ligand is coordinated on a metal, organic inorganic complex salts wherein an organic ligand and an inorganic ligand are coordinated on a metal, and metal alkoxides wherein a metal and an organic molecule are covalently bonded via oxygen. Of these, use of a metal chelate compound wherein the ligand has two or more donor atoms forming a ring containing the metal atom is preferable in view of the stability of the organic complex compound itself and the stability of the solution of the composition for the heat sensitive layer.

Typical preferable examples of the metal that forms an organic complex compound include Al(III), Ti(IV), Mn(II), Mn(III), Fe(II), Fe(III), Co(II), Co(III), Ni(II), Ni(IV), Cu(I), Cu(II), Zn(II), Ge, In, Sn(II), Sn(IV), Zr(IV), and Hf(IV). Al(III) is particularly preferable in view of the effects of improving the sensitivity and Ti (IV) is particularly preferable in view of realizing durability to printing inks and ink detergents.

Examples of the ligand include compounds having coordinated groups having oxygen, nitrogen, sulfur, or the like as the donor atom. Examples of the coordinated groups include those having oxygen as the donor atom such as —OH (alcohol, enol, and phenol), —COOH (carboxylic acid), >C=O (aldehyde, ketone, and quinone), —O— (ether), —COOR (ester wherein R represents a aliphatic or aromatic hydrocarbon), —N=O (nitroso compound), —NO$_2$ (nitro compound), >N—O (N-oxide), —SO$_3$H (sulfonic acid), —PO$_3$H$_2$ (phosphorous acid), and the like; those having nitrogen as the donor atom such as —NH$_2$ (primary amine, hydrazine), >NH (secondary amine), >N— (tertiary amine), —N=N— (azo compound, heterocycle compound), =N—OH (oxime), —NO$_2$ (nitro compound), —N=O (nitroso compound), >C=N— (Schiff base, heterocycle compound), >C=NH (aldehyde, ketoneimine, enamines), —NCS (isothiocyanate) and the like; and those having sulfur as the donor atom such as —SH (thiol), —S— (thioether), >C=S (thioketone and thio amide), =S— (heterocycle compound), —C(=O)—SH, —C(=S)—OH, —C(=S)—SH (thiolcarboxylic acid), and —SCN (thiocyanate).

Of the organic complex compound formed from a metal and a ligand as described above, the compounds preferable for use include complex compounds of metal such as Al(III), Ti(IV), Fe(II), Fe(III), Mn(III), Co(II), Co(III), Ni(II), Ni(IV), Cu(I), Cu(II), Zn(II), Ge, In, Sn(II), Sn(IV), Zr(IV), and Hf(IV) with a β-diketone, an amine, an alcohol, or a carboxylic acid; and the most preferable complex compounds include acetyl acetone complex and acetoacetic acid ester complex of Al(III), Fe(II), Fe(III), Ti(IV), and Zr(IV).

Examples of such compounds include the following compounds, namely, aluminum tris(acetylacetonate), aluminum tris(ethylacetoacetate), aluminum tris(propylacetoacetate), aluminum tris(butylacetoacetate), aluminum tris(hexylacetoacetate), aluminum tris(nonylacetoacetate), aluminum tris(hexafluoropentadionate), aluminum tris(2,2,6,6-tetramethyl-3,5-heptanedionate), aluminum bis(ethylacetoacetate) mono(acetylacetonate), aluminum bis(acetylacetonate) mono(ethylacetoacetate), aluminum bis(propylacetoacetate) mono(acetylacetonate), aluminum bis(butylacetoacetate) mono(acetylacetonate), aluminum bis(hexylacetoacetate) mono(acetylacetonate), aluminum bis(propylacetoacetate) mono(ethylacetoacetate), aluminum bis(butylacetoacetate) mono(ethylacetoacetate), aluminum bis(hexylacetoacetate) mono(ethylacetoacetate), aluminum bis(nonylacetoacetate) mono(ethylacetoacetate), aluminum dibutoxide mono (acetylacetonate), aluminum diisopropoxidemono (acetylacetonate), aluminum diisopropoxidemono (ethylacetoacetate), aluminum-s-butoxide bis (ethylacetoacetate), aluminum di-s-butoxide mono (ethylacetoacetate), aluminum diisopropoxidemono(-9-octadecenylacetoacetate), titanium triisopropoxide mono (allylacetoacetate), titanium diisopropoxide bis (triethanolamine), titanium di-n-butoxide bis (triethanolamine), titanium diisopropoxide bis (acetylacetonate), titanium di-n-butoxide bis (acetylacetonate), titanium diisopropoxide bis(2,2,6,6-tetramethyl-3,5-heptanedionate), titanium diisopropoxide bis(ethylacetoacetate), titanium di-n-butoxide bis(ethylacetoacetate), titanium tri-n-butoxide mono(ethylacetoacetate), titanium triisopropoxide mono(methacryl oxyethylacetoacetate), titanium oxide bis(acetylacetonate), titanium tetra(2-ethyl-3-hydroxyhexyl oxide), titanium dihydroxy bis (lactate), titanium (ethylene glycolate)bis(dioctyl phosphate), zirconium di-n-butoxide bis(acetylacetonate), zirconium tetrakis(hexafluoropentanedionate), zirconium tetrakis (trifluoropentanedionate), zirconium tri-n-propoxide mono (methacryl oxyethylacetoacetate), zirconium tetrakis (acetylacetonate), zirconium tetrakis(2,2,6,6-tetramethyl-3,5-heptanedionate), triglycolate zirconate, trilactate zirconate, iron (III) acetylacetonate, dibenzoylmethane iron (II), tropolone iron, tristropolono iron (III), hinokitiol iron, trishinokitiolo iron (III), acetoacetic acid ester iron (III), iron (III) benzoyl acetonate, iron (III) diphenylpropanedionate, iron (III) tetramethylheptanedionate, and iron (III) trifluoropentanedionate, which may be included in combination of two or more.

Such organic complex compound functions as a crosslinking agent for a polymer, and its content in the heat sensitive layer is preferably at least 0.5% by weight. The content is preferably up to 50% by weight for retaining the printing durability of the lithographic printing plate.

Furthermore, when a novolac resin is used for the polymer in the composition for the heat sensitive layer, weight ratio of the novolac resin to the organic complex compound is preferably at least 2, more preferably at least 2.5, and still more preferably at least 3 in view of increasing the precision of the image reproduced. The weight ratio of the novolac resin to the organic complex compound is preferably up to 6, more preferably up to 5.5, and still more preferably up to 5 for the formation of a dense crosslinking structure of the novolac resin and improving the hardness of the heat sensitive layer. When the weight ratio of the novolac resin to the organic complex compound is as described above, the heat sensitive layer will have an increased hardness and deformation of the ink repellent layer (the upper layer) will be facilitated upon application of the friction to the plate surface in the development, and as a consequence, image reproducibility will be improved since breakage and peeling of the ink repellent layer is facilitated.

In the present invention, the photothermal substance which can contain the composition (A) and the composition (B) of the heat sensitive layer include those having the function of absorbing the laser beam to convert the light energy to kinetic energy of atoms and molecules to instantaneously generate a heat of at least 200° C. on the surface of the heat sensitive layer, thereby thermally decomposing the crosslinking structure of the heat sensitive layer. The particularly preferred are infrared- and near infrared-absorbing pigments and dyes including black pigments such as carbon black, carbon graphite, aniline black, and cyanine black, green pigments such as phthalocyanine and naphthalocyanine, inorganic compounds containing water of crystallization, powders of a metal such as iron, copper, chromium, bismuth, magnesium, aluminum, titanium, zirconium, cobalt, vanadium, manganese, and tungsten, and sulfate, hydroxide, silicate salt, sulphate, phosphate salt, diamine compound complex, complex of dithiol compound, complex of phenol thiol compound, complex of mercapto phenol compound of such a metal.

Exemplary preferable infrared- and near infrared-absorbing dyes include dyes having the maximum absorption wavelength in the range of 700 nm to 1500 nm used for electronic and recording applications such as cyanine dyes, azulenium dyes, squarilium dyes, croconium dyes, azo disperse dyes, bisazostilbene dyes, naphthoquinone dyes, anthraquinone dyes, perylene dyes, phthalocyanine dyes, naphthalocyanine metal complex dyes, polymethine dyes, dithiolnickel complex dyes, indoaniline metal complex dyes, intermolecular CT dyes, benzothiopyran spiropyran, and nigrosine dyes.

Of such dyes, the preferred for use are those having a high molar absorption coefficient ε. More specifically, ε is preferably at least $1 \times 10^4$ L/(mol·cm) and more preferably at least $1 \times 10^5$ L/(mol·cm). When the ε is at least $1 \times 10^4$ L/(mol·cm), improvement in the initial sensitivity will be possible. The coefficient is based on the active energy ray irradiated, and specific wavelengths may be 780 nm, 830 nm, or 1064 nm.

The heat sensitive layer may contain two or more such photothermal substance. Incorporation of two or more photothermal substances each having different absorption wavelength enables use of two or more laser beams each having different emission wavelength.

Of these, the preferred are carbon black and infrared-or near infrared-absorbing dyes in view of the photothermal efficiency, economy, and handling convenience.

Content of such photothermal substance in the heat sensitive layer is preferably 0.1% by weight to 70% by weight and more preferably 0.5% by weight to 40% by weight. Use of the photothermal substance at a content of at least 0.1% by weight enables further improvement in the sensitivity to the laser beam while the use at a content of up to 70% by weight enables retention of the high printing durability of the lithographic printing plate.

In the precursor for lithographic printing of the present invention, the heat sensitive layer may contain various additives as necessary. For example, a silicone surfactant and a fluorosurfactant may be incorporated for the purpose of improving coating property. Alternatively, a silane coupling agent or a titanium coupling agent may be incorporated to improve the adhesion with the ink repellent layer.

Content of such additives may vary according to the intended use, and typical preferable content in the entire solid content of the heat sensitive layer is 0.1% by weight to 30% by weight.

In the precursor for lithographic printing of the present invention, a layer comprising a silicone rubber prepared by crosslinking an organopolysiloxane is preferable for use as the ink repellent layer. In addition, the silicone rubber preferably has a structure derived from a SiH group-containing compound (a) and vinyl group-containing polysiloxane (b).

Exemplary silicone rubber layers include a layer prepared by coating an addition-type composition for the silicone rubber layer or a condensation-type composition for the silicone rubber layer as well as a layer prepared by coating a solution of such composition and drying the coating.

The addition-type composition for the silicone rubber layer preferably contains at least a vinyl group-containing polysiloxane (b) and a SiH group-containing compound (a) having a plurality of hydrosilyl groups, and a curing catalyst, and optionally, a reaction suppressing agent. In addition, the vinyl group-containing polysiloxane (b) is preferably a vinyl group-containing organopolysiloxane.

In the addition-type silicone rubber, new siloxane units represented by the following general formula (ii) is generated as crosslinking points of the silicone rubber by the reaction of the SiH group-containing compound (a) and the vinyl group-containing polysiloxane (b). Crosslink density of the silicone rubber can be estimated by using molar ratio of the new siloxane unit represented by the following general formula (ii) to the dimethylsiloxane unit represented by the following general formula (i) which is the base component of the silicone rubber (molar ratio (ii)/(i)). The molar ratio (ii)/(i) of the siloxane unit may be determined as the ratio of the area of the peak corresponding to the Si* of the siloxane unit represented by the following general formula (ii) observed in $^{29}$Si NMR spectrum of the solid silicone rubber to the area of the peak corresponding to the Si* of the dimethylsiloxane unit represented by the following general formula (i), namely, as the peak area ratio (ii)/(i). The measurement procedure is described in detail in the section of the Examples.

Si—O—Si*(CH$_3$)$_2$—O—Si    (i)

—CH$_2$—Si*(CH$_3$)$_2$—O—Si    (ii)

The molar ratio (ii)/(i) of the siloxane unit as described above is preferably at least 0.00240 and more preferably at least 0.00245 in view of preventing excessive decrease of the elastic modulus of the plate surface and retaining the image reproduction and the printing durability. Also, the molar ratio (ii)/(i) is preferably up to 0.00900, more preferably up to 0.00880, and still more preferably up to 0.00500 in view of suppressing the decrease in the printing durability by brittle fracture of the silicone rubber.

The vinyl group-containing polysiloxane (b) is the one having the structure represented by the following general formula (b1) and it has the vinyl group in the terminal of the backbone or in the backbone. Of these, the preferred is the one having the vinyl group on the terminal of the backbone. The vinyl group-containing polysiloxane (b) may be used in combination of two or more.

—(SiR$^1$R$^2$—O—)$_n$—    (b1)

In the general formula (b1), n is an integer of at least 2, and R$^1$ and R$^2$ are a saturated or unsaturated hydrocarbon group containing 1 to 50 carbon atoms. The hydrocarbon group may be a straight chain, branched, or cyclic group, and it may contain an aromatic ring. The R$^1$ and R$^2$ may be the same or different. The plurality of R$^1$ in the polysiloxane of the general formula (b1) may be the same or different, and also, the plurality of R$^2$ in the polysiloxane of the general formula (b1) may be the same or different.

With regard to the R$^1$ and the R$^2$ in the general formula (b1), at least 50% is preferably methyl group in view of the ink repellency of the lithographic printing plate. In view of the image reproducibility as well as the ink repellency and scratch resistance of the lithographic printing plate, weight average molecular weight of the vinyl group-containing polysiloxane (b) is preferably at least 30,000 and up to 100,000.

Examples of the SiH group-containing compound (a) include organohydrogen polysiloxanes and organic polymers having diorganohydrogen silyl group, and the preferred is the organohydrogen polysiloxane, which may be used in combination of two or more.

The organohydrogen polysiloxane may have any of the straight chain, cyclic, branched, and network molecular structures, and examples are shown below.

A methyl hydrogen polysiloxane having the opposite ends of the molecular chain capped with trimethylsiloxy group, a dimethylsiloxane-methyl hydrogen siloxane copolymer having the opposite ends of the molecular chain capped with trimethylsiloxy group, a dimethylsiloxane-methyl hydrogen siloxane-methylphenylsiloxane copolymer having the opposite ends of the molecular chain capped with trimethylsiloxy group, a dimethylpolysiloxane having the opposite ends of the molecular chain capped with dimethyl hydrogen siloxy group, a dimethylsiloxane-methylphenylsiloxane copolymer having the opposite ends of the molecular chain capped with dimethyl hydrogen siloxy group, and a methylphenyl polysiloxane having the opposite ends of the molecular chain capped with dimethyl hydrogen siloxy group.

Also included are organopolysiloxane copolymers comprising the siloxane structural unit represented by the formula: R$_3$SiO$_{1/2}$, the siloxane structural unit represented by the formula: R$_2$HSiO$_{1/2}$, and siloxane structural unit represented by the formula: SiO$_{4/2}$; organopolysiloxane copolymers comprising the siloxane structural unit represented by the formula: R$_2$HSiO$_{1/2}$ and the siloxane structural unit represented by the formula: SiO$_{4/2}$; and organopolysiloxane copolymers comprising the siloxane structural unit represented by the formula: RHSiO$_{2/2}$, the siloxane structural unit represented by the formula: RSiO$_{3/2}$, and the siloxane structural unit represented by the formula: HSiO$_{3/2}$; which may be used in combination of two or more. In the formulae as described above, R independently represents an optionally substituted monovalent hydrocarbon group other than alkenyl group. Exemplary such groups include alkyl groups such as methyl group, ethyl group, propyl group, butyl group, pentyl group, hexyl group, and heptyl group; aryl groups such as phenyl group, tolyl group, xylyl group, and naphthyl group; aralkyl groups such as benzyl group and phenethyl group; and halogenated alkyl groups such as chloromethyl group, 3-chloropropyl group, and 3,3,3-trifluoropropyl group.

Examples of the organic polymers having a diorganohydrogen silyl group include oligomers prepared by copolymerizing a (meth)acryl monomer containing dimethyl hydrogen silyl group such as dimethyl hydrogen silyl(meth)acrylate and dimethyl hydrogen silylpropyl (meth)acrylate and a monomer such as methyl (meth)acrylate, ethyl (meth)acrylate, butyl (meth)acrylate, ethylhexyl (meth)acrylate, lauryl (meth)acrylate, styrene, α-methylstyrene, maleic acid, vinyl acetate, and allyl acetate.

The SiH group-containing compound (a) which is a copolymer of the siloxane structural unit represented by the following general formula (I) and the siloxane structural unit represented by the general formula (II) is preferable in view of the ink repellency and cost.

—[SiH(CH$_3$)—O—]—          (I)

—[Si(CH$_3$)$_2$—O—]—          (II)

In the SiH group-containing compound (a), ratio of the content of the siloxane structural unit represented by the general formula (I) in the total of the siloxane structural unit represented by the general formula (I) and the siloxane structural unit represented by the general formula (II) is preferably at least 50% by mole and more preferably at least 60% by mole in view of increasing the amount of the reactive functional group per molecule and to improve elastic modulus of the plate surface. While the ratio of the content of the siloxane structural unit represented by the general formula (I) may be 100% by mole, the ratio is preferably up to 99% by mole in view of improving the ink repellency and preventing brittleness by excessive increase of the crosslinking point.

Molar ratio of the number of SiH group in the SiH group-containing compound (a) to the number of vinyl group in the vinyl group-containing polysiloxane (b) used in the present invention (the number of SiH groups/the number of vinyl groups) is highly related to the elastic modulus of the plate surface and the ink repellency. More specifically, the elastic modulus of the plate surface will be higher with the increase in the ratio of the number of SiH groups to the number of vinyl groups due to increase in the crosslink density. On the other hand, the ink repellency will be reduced because of the high affinity of the SiH with the ink which counteracts the ink repellency.

The molar ratio of the number of SiH group in the SiH group-containing compound (a) to the number of vinyl group in the vinyl group-containing polysiloxane (b) (the number of SiH groups/the number of vinyl groups) is preferably at least 2 and up to 6. The molar ratio of the number of SiH groups to the number of vinyl groups is preferably at least 2 and more preferably at least 2.5 in view of realizing sufficient elastic modulus of the plate surface necessary for a high definition image. In the meanwhile, the ratio is preferably up to 6 and more preferably up to 5 to prevent loss of the ink repellency and suppressing brittle fracture of the ink repellent layer.

Example of the reaction suppressing agent that may be incorporated in the addition-type composition for the silicone rubber layer include nitrogen-containing compounds, phosphorus compounds, and unsaturated alcohols, and the preferred are acetylene group-containing alcohols. These may be used in combination of two or more. Addition of such reaction suppressing agent enables control of the curing speed of the silicone rubber layer. Content of the reaction suppressing agent in the composition for the silicone rubber layer is preferably at least 0.01% by weight and more preferably at least 0.1% by weight in view of the stability of the composition for the silicone rubber layer and its solution. The content of the reaction suppressing agent in the composition for the silicone rubber layer is preferably up to 20% by weight and more preferably up to 15% by weight in view of the curability of the silicone rubber layer.

In the addition-type composition for the silicone rubber layer, the curing catalyst may be selected from known curing catalysts. The curing catalysts is preferably a platinum compound, for example, simple substance of platinum, platinum chloride, chloroplatinic acid, olefin-coordinated platinum, alcohol-modified complex of the platinum, methylvinylpolysiloxane complex of the platinum, which may be used in combination of two or more. Content of the curing catalyst in the composition for the silicone rubber layer is preferably at least 0.001% by weight and more preferably at least 0.01% by weight in view of curability of the silicone rubber layer. In view of the stability of the composition for the silicone rubber layer and its solution, the content in the composition for the silicone rubber layer is preferably up to 20% by weight and more preferably up to 15% by weight.

In addition to such components, the addition-type composition for the silicone rubber layer may also contain, for example, hydroxy group-containing organopolysiloxane, hydrolysable functional group-containing silane or a siloxane containing such functional group, a known filler such as silica for the purpose of improving the rubber strength, and a known silane coupling agent for the purpose of improving the adhesion. Exemplary preferable silane coupling agents include alkoxysilanes, acetoxy silanes, and ketoximinosilanes, and the preferred are those having vinyl group or allyl group directly bonded to the silicon atom.

The condensation-type composition for the silicone rubber layer is preferably prepared, at least, from a hydroxy group-containing organopolysiloxane, a crosslinking agent, and a curing catalyst.

The hydroxy group-containing organopolysiloxane is the one having a structure represented by the general formula (I), and it has hydroxy group on the terminal of the backbone or in the backbone. Of these, the preferred is the one having the hydroxy group on the terminal of the backbone. The hydroxy group-containing organopolysiloxane may be used in combination of two or more.

Examples of the crosslinking agent in the condensation-type composition for the silicone rubber layer include silicon compounds of de-acetic acid type, de-oxime type, de-alcohol type, de-acetone type, de-amide type, de-hydroxylamine type and other types represented by the following general formula (III):

(R$^3$)$_{4-m}$SiX$_m$          (III)

In the formula (III), m is an integer of 2 to 4, R$^3$ is independently a substituted or unsubstituted alkyl group, alkenyl group, or aryl group containing 1 or more carbon atoms or a group which is a combination thereof, and X is independently a hydrolyzable group. Exemplary hydrolyzable groups include asiloxy groups such as acetoxy group, ketoxime groups such as methylethylketoxime group, alkoxy groups such as methoxy group, ethoxy group, propoxy group, and butoxy group, alkenyloxy groups such as isopropenoxy group, acylalkylamino groups such as acetylethylamino group, and aminoxy groups such as dimethylaminoxy group. In the formula (III), the number of the hydrolyzable group m is preferably 3 or 4.

Examples of the compounds that can be used for the crosslinking agent in the condensation-type composition for the silicone rubber layer include acetoxy silanes such as methyltriacetoxysilane, ethyltriacetoxysilane, vinyltriacetoxysilane, allyltriacetoxysilane, phenyltriacetoxysilane, and tetraacetoxysilane; ketoxyiminosilanes such as vinylmethylbis(methylethylketoxyimino)silane, methyltris(methylethylketoxyimino)silane, ethyltri(methylethylketoxyimino) silane, vinyltris(methylethylketoxyimino)silane, allyltris(methylethylketoxyimino)silane, phenyltris(methylethylketoxyimino)silane, and tetrakis(methylethylketoxyimino)silane; alkoxysilanes such as methyltrimethoxysilane, methyltriethoxysilane, ethyltrimethoxysilane, ethyltriethoxysilane, tetraethoxysilane, tetrapropoxysilane, vinyltrimethoxysilane, vinyltriethoxysilane, allyltriethoxysilane, and vinyltriisopropoxysilane; alkenyloxysilanes such as vinyltrisisopropenoxysilane, diisopropenoxydimethylsilane, and triisopropenoxymethylsilane; and tetraallyloxysilane.

Of these, the preferred are acetoxy silanes and ketoximinosilanes in view of the curing speed of the silicone rubber layer and handling convenience. These compounds may be used in combination of two or more.

When the crosslinking agent as described above is mixed with a hydroxy group-containing organopolysiloxane, the crosslinking agent may reacts with the silanol group, and an organosiloxane having the crosslinking agent bonded thereto instead of the silanol group may be formed. Accordingly, in some cases, the condensation-type composition for the silicone rubber layer contains only the organosiloxane having the crosslinking agent bonded thereto and not the organosiloxane containing the silanol group.

In the condensation-type composition for the silicone rubber layer, content of the crosslinking agent in the composition for the silicone rubber layer is preferably at least 0.5% by weight and more preferably at least 1% by weight in view of the stability of the composition for the silicone rubber layer and its solution. Also, the content in the composition for the silicone rubber layer is preferably up to 20% by weight and more preferably up to 15% by weight in view of the strength of the silicone rubber layer and scratch resistance in the lithographic printing plate.

Examples of the curing catalyst used in the condensation-type composition for the silicone rubber layer include organic carboxylic acids, acids, alkalis, amines, metal alkoxides, metal diketonates, and organic acid salts of a metal such as tin, lead, zinc, iron, cobalt, calcium, and manganese, and more particularly, dibutyl tin diacetate, dibutyl tin dioctate, dibutyl tin dilaurate, zinc octylate, and iron octylate, which may be used in combination of two or more.

In the condensation-type composition for the silicone rubber layer, content of the curing catalyst in the composition for the silicone rubber layer is preferably at least 0.001% by weight and more preferably at least 0.01% by weight in view of curability and adhesion of the silicone rubber layer. The content in the composition for the silicone rubber layer is also preferably up to 15% by weight, and more preferably up to 10% by weight in view of the stability of the composition for the silicone rubber layer and its solution.

In the ink repellent layer of the precursor for lithographic printing of the present invention, an ink repellent liquid may be incorporated for the purpose of improving the ink repellency or suppressing the brittle fracture of the ink repellent layer caused by decrease of the elastic modulus of the plate surface. This ink repellent liquid may preferably have a boiling point at 1 atmosphere of at least 150° C. When pressure is applied to the plate surface in the course of printing, the ink repellent liquid will emerge on the surface of the ink repellent layer to facilitate peeling of the ink and the ink repellency is thereby improved. When the boiling point is at least 150° C., the ink repellent liquid will not be volatilized in the production of the precursor for lithographic printing, and the ink repellency effect realized by the addition of this ink repellent liquid will not be lost. The boiling point as used herein is defined by the temperature when the weight loss reaches the level of at least 0.5% by weight when the ink repellent liquid is allowed to stand for 1 hour in an atmosphere of 1 atmosphere. In other words, weight loss of this ink repellent liquid is less than 0.5% by weight when it is allowed to stand at 150° C. for 1 hour in an atmosphere of 1 atmosphere. Accordingly, the ink repellency effect realized by the addition of this ink repellent liquid will not be lost.

In addition, the ink repellent liquid preferably has a surface tension at 25° C. of at least 15 mN/m and up to 30 mN/m. When the surface tension is at least 15 mN/m, affinity with the rest of the composition of the ink repellent layer will be improved and stability of the solution of the composition of the ink repellent layer is thereby improved. When the surface tension is up to 30 mN/m, peeling of the ink will be facilitated, and the ink repellency will be further improved.

When the ink repellent liquid is added to the ink repellent layer, it partly inhibits the crosslinking, and the elastic modulus of the plate surface will be reduced. Content of the ink repellent liquid in the ink repellent layer is preferably at least 4% by weight and more preferably at least 4.5% by weight in view of reducing the elastic modulus of the plate surface to suppress loss of the printing durability by brittle fracture. In view of retaining the elastic modulus of the plate surface, the content of the ink repellent liquid in the ink repellent layer is preferably up to 40% by weight, more preferably up to 14% by weight, and still more preferably up to 10% by weight.

The ink repellent liquid is preferably a silicone compound, and more preferably a silicone oil. The term silicone oil as used in the present invention is a free polysiloxane component which will not engage in the crosslinking of the ink repellent layer. Accordingly, examples are dimethyl silicone oils such as dimethyl-terminated polydimethylsiloxane, cyclic polydimethylsiloxane, dimethyl-terminated polydimethyl-polymethylphenyl siloxane copolymer, and dimethyl-terminated polydimethyl-polydiphenyl siloxane copolymer; and modified silicone oils having various organic groups introduced in a part of the methyl group in the molecule such as alkyl-modified silicone oil, fluorine-modified silicone oil, polyether-modified silicone oil, alcohol-modified silicone oil, amino-modified silicone oil, epoxy-modified silicone oil, epoxypolyether-modified silicone oil, phenol-modified silicone oil, carboxy-modified silicone oil, mercapto-modified silicone oil, amide-modified silicone oil, carnauba-modified silicone oil, and higher fatty acid-modified silicone oil.

Molecular weight of such silicone oil may be measured by gel permeation chromatography (GPC) using polystyrene for the standard, and the preferred are those having weight average molecular weight Mw of 1000 to 100000.

In the precursor for lithographic printing of the present invention, the elastic modulus of the plate surface is at least 25 MPa and up to 35 MPa. The elastic modulus of the plate surface is the one determined by nanoindentation method, namely, by pushing a diamond pyramid indenter into the surface of the ink repellent layer of the lithographic printing precursor and depicting a load-indentation depth curve to thereby enable calculation of the elastic modulus in relation to the load. The elastic modulus of the plate surface is defined by the elastic modulus when a load of 14000 N/m$^2$ is applied to the surface of the precursor for lithographic printing. The procedure is described in detail in the section of the Examples.

The elastic modulus of the plate surface is at least 25 MPa and preferably at least 26 MPa in view of improving the film strength of the ink repellent layer to facilitate fracturing of the layer without undergoing elongation so that the image reproduced will have a higher precision. In view of suppressing loss of the printing durability by brittle fracture of the ink repellent layer, the elastic modulus of the plate surface is up to 35 MPa and preferably up to 34 MPa.

In the precursor for lithographic printing of the present invention, the ink repellent layer preferably has a surface roughness Ra of up to 0.40 µm. The surface roughness Ra is readily measurable by using a laser microscope. When the surface roughness Ra is up to 0.40 µm, development failure caused by the uneven thickness of the ink repellent layer will be suppressed, and line breakage will be suppressed even in the case of fine lines of up to 10 µm. The surface roughness Ra of the ink repellent layer is more preferably up to 0.35 µm.

The precursor for lithographic printing of the present invention may have a protective film and/or interleaving paper on the surface of the ink repellent layer for the purpose of protecting the ink repellent layer.

The protective film is preferably a film having a thickness of up to 100 µm which allows sufficient passage of the light having the wavelength of the light source used for the exposure. Typical materials for the film include polyethylene, polypropylene, polyvinyl chloride, polyethylene terephthalate, and cellophane. If desired, various light-absorbing agents, photochromic substances, and photobleaching substances as disclosed in Japanese Patent No. 2938886 may be provided on the protective film in order to prevent response of the precursor to the light.

The interleaving paper is preferably the one having a weight of 30 to 120 g/m$^2$ and more preferably 30 to 90 g/m$^2$. The interleaving paper will have sufficient mechanical strength when it has a weight of at least 30 g/m$^2$. On the other hand, use of an interleaving paper of up to 120 g/m$^2$ is advantageous not only in terms of economy but also in view of handling convenience since the laminate with the precursor for lithographic printing will be thinner. Exemplary non-limiting preferable interleaving papers include information recording paper (40 g/m$^2$, manufactured by Nagoya Pulp Co., Ltd.), metal interleaving paper (30 g/m$^2$, manufactured by Nagoya Pulp Co., Ltd.), unbleached kraft paper (50 g/m$^2$, manufactured by Chuetsu Pulp & Paper Co., Ltd.), NIP paper (52 g/m$^2$, manufactured by Chuetsu Pulp & Paper Co., Ltd.), pure white roll paper (45 g/m$^2$, manufactured by Oji Paper Co., Ltd.), and Clupack (73 g/m$^2$, manufactured by Oji Paper Co., Ltd.).

Next, the method for producing a lithographic printing plate from the precursor for lithographic printing of the present invention is described. The production method of the lithographic printing plate comprises the step of exposing the precursor for lithographic printing according to the image (exposure step), and the step of physically stimulating the precursor for lithographic printing to remove the ink repellent layer in the area exposed to the light (development step). The lithographic printing plate corresponds to the precursor for lithographic printing from which the ink repellent layer on its surface has been removed in the area corresponding to the exposed image.

First, the exposure step is described. In the exposure step, the precursor for lithographic printing of the present invention is exposed in correspondence with the image. When the precursor for lithographic printing has a protective film, the exposure may be conducted either through the protective film or after removing the protective film. The light source used in the exposure step may be the one having an emission wavelength region in the range of 300 nm to 1500 nm. Of these, the preferred are semiconductor laser and YAG laser having the emission wavelength region in the proximity of the near infrared region since this wavelength is widely used as the absorption wavelength of the heat sensitive layer. More specifically, the preferred is use of a laser beam having a wavelength of 780 nm, 830 nm, and 1064 nm in view of the photothermal conversion efficiency.

Next, the development step is described. In the development step, the ink repellent layer in the area exposed to the light is removed by applying physical stimulus to the precursor for lithographic printing after the exposure. The method used for physical stimulus may be, for example, (i) a method wherein the plate surface is wiped with a nonwoven fabric, absorbent cotton, fabric, sponge, or the like that has been impregnated with a developer, (ii) a method wherein the plate surface is pre-treated with the developer and then rubbed with a rotary brush while spraying with tap water, and (iii) a method wherein high-pressure cold water or warm water or steam is injected to the plate surface.

If necessary, a pre-treatment of immersing the precursor for lithographic printing in a pre-treatment liquid for a certain time may be conducted before the development. Examples of the liquid used for the pre-treatment include water, water having a polar solvent such as an alcohol, ketone, ester, or carboxylic acid added thereto, a solvent containing at least one aliphatic hydrocarbon or aromatic hydrocarbon having a polar solvent added thereto, and a polar solvent. The pre-treatment liquid may also be, for example, a pre-treatment liquid containing polyethylene ether diol and diamine compound containing two or more primary amino groups as described in Japanese Patent No. 4839987. Specific examples of the pre-treatment liquid include PP-1, PP-3, PP-F, PP-FII, PTS-1, CP-1, CP-Y, NP-1, and DP-1 (all of these are manufactured by Toray Industries, Inc.).

The developer used may be water, an alcohol, or a paraffin hydrocarbon. The developer may also be a mixture of propylene glycol, dipropylene glycol, triethylene glycol, polypropylene glycol, or a propylene glycol derivative such an alkylene oxide adduct of polypropylene glycol with water. Specific examples of the developer include HP-7N and WH-3 (both manufactured by Toray Industries, Inc.). Such developer composition may also contain a known surfactant. The surfactant used is preferably the one having a pH of 5 to 8 when prepared into an aqueous solution in view of safety and cost upon disposal. Content of the surfactant in the developer is preferably up to 10% by weight. Such developer is preferable in view of safety and economy such as cost upon disposal. Furthermore, use of a glycol compound or a glycol ether compound for the main component is preferable and simultaneous use of an amine compound is more preferable.

In addition, in order to improve visibility of the imaging areas and measurement precision of halftone dots, the pre-treatment liquid or the developer may also contain a dye such as Crystal Violet, Victoria Pure Blue, Astrazon Red, or the like to accomplish dyeing of the ink accepting layer of the imaging areas simultaneously with the development. The dyeing may also be conducted after the development by using a solution having the dye as described above added thereto.

A part of or all of the development step as described above can be conducted automatically by an automatic processor. Examples of such automatic processor include a system solely consisting of a development section, a system wherein the pre-treatment section and the development section are provided in this order, a system wherein the pre-treatment section, the development section, and a post-treatment section are provided in this order, and a system wherein the development section, a post-treatment section, and a water washing section are provided in this order. Specific examples of such automatic processor include TWL-650 series, TWL-860 series, and TWL-1160 series (all manufactured by Toray Industries, Inc.) and the like as well as an automatic processor wherein the stand has a curved recess in order to prevent scratching of the plate rear surface as described in Japanese Unexamined Patent Publication (Kokai) No. 5-6000. These may be used in combination of two or more.

As a preparation for the case wherein the developed lithographic printing plates are stored by stacking, an interleaving paper is preferably placed between the plates for the purpose of protecting the plate surface.

Next, an embodiment of the method for producing a printed material from the waterless lithographic printing plate of the present invention is described. The waterless lithographic printing plate is a lithographic printing plate which can be used in the printing without using damping water. A layer derived from the heat sensitive layer having the ink repellent layer removed therefrom will function as the ink accepting layer, and accordingly, as the imaging area. The ink repellent layer will be the non-imaging area. The ink accepting layer and the ink repellent layer are substantially in the same plane except for the micron-order difference in the level, and the printing is accomplished by depositing the ink only on the imaging areas by using difference in the ink attaching ability, and then transferring the ink to the printing substrate. The term "printing substrate" designates all media that can be used for printing including thin paper, thick paper, film, and label with no particular limitation. The ink may be transferred to the printing substrate either directly from the lithographic printing plate or by using a blanket.

The printing using the waterless lithographic printing plate of the present invention also includes the step of irradiating the ink that has been transferred to the printing substrate with an active energy ray. In this case, the ink used is the one curable with an active energy ray. When the ink is an ink curable by UV ray irradiation (hereinafter referred to as the UV ink), the ink typically contains photoreactive components that promote polymerization reaction upon the UV ray irradiation such as a reactive monomer or a reactive oligomer, a photopolymerization initiator, and optionally, a sensitizer. In the UV printing using the waterless lithographic printing plate, content of the photosensitive component in the ink is preferably at least 10% by weight and up to 50% by weight. When the content of the photosensitive component is less than 10% by weight, curing speed will be reduced and the printing substrate will be stacked before the UV ink is sufficiently cured and this results in the transfer/setoff of the ink to the adjacent substrate. On the other hand, ink repellency will reduced with the increase in the content of the photosensitive component, and the content of the photosensitive component in excess of 50% by weight is likely to result in the remaining of the ink in the non-imaging area.

In addition, a UV ink containing an acrylate or methacrylate containing a straight chain alkyl group may be used for improving the ink repellency. The straight chain alkyl group is preferably the one containing at least 9 carbon atoms. Examples of the acrylate containing a straight chain alkyl group include nonyl acrylate, decyl acrylate, undecyl acrylate, dodecyl acrylate, tridecyl acrylate, tetradecyl acrylate, pentadecyl acrylate, hexadecyl acrylate, heptadecyl acrylate, octadecyl acrylate, and isooctadecyl acrylate, and examples of the methacrylate containing a straight chain alkyl group include nonyl methacrylate, decyl methacrylate, undecyl methacrylate, dodecyl methacrylate, tridecyl methacrylate, tetradecyl methacrylate, pentadecyl methacrylate, hexadecyl methacrylate, heptadecyl methacrylate, and octadecyl methacrylate.

Content of the acrylate or methacrylate containing the straight chain alkyl group in the total content of the UV ink is preferably at least 0.5% by weight, and more preferably at least 1% by weight in view of improving the ink repellency. The content is preferably up to 15% by weight, and more preferably up to 10% by weight in view of promoting curing of the UV ink.

The active energy ray used for the irradiation of the UV ink may be any ray as long as it has an excitation energy necessary for the curing reaction, and preferable examples include UV and electron beams. When the curing is conducted by electron beam, the preferred is use of an electron beam irradiation system capable of emitting an electron beam of 100 to 500 eV. When the curing is conducted by UV beam, exemplary non-limited systems include UV irradiation system such as high pressure mercury lamp, xenon lamp, metal halide lamp, and LED.

In the printing using the waterless lithographic printing plate, the ink repellency of the lithographic printing plate can be evaluated by measuring scumming start temperature. The term "scumming" refers to the condition wherein the ink remains in the non-imaging area of the lithographic printing plate and the ink in the non-imaging area is transferred to the areas of the printing substrate where attachment of the ink is not originally intended. In the waterless printing, scumming is likely to occur when the plate surface temperature is higher. Stable printing is enabled when the scumming does not occur, and the staring temperature of the scumming of the plate surface is referred to as the "scumming start temperature". Printing will be easier when the scumming start temperature is higher. In the case of the printer equipped with a cooling mechanism, the scumming start temperature is preferably at least 24° C., and more preferably at least 26° C. The worsening of the scumming when the printing is continued at the scumming start temperature can be evaluated in terms of "printable number of sheets before plate wear". The printable number of sheets before plate wear is preferably at least 20000, more preferably at least 50000, and still more preferably at least 80000. This printable number of sheets before plate wear is correlated with the elastic modulus of the plate surface, and physical strength of the ink repellent layer is maintained when the elastic modulus of the plate surface is at least 25 MPa, and loss of printing durability due to brittle fracture of the ink repellent layer does not occur when this elastic modulus is up to 35 MPa.

EXAMPLES

Next, the present invention is described in further detail by referring to the Examples. The evaluations in the Examples and Comparative Examples were conducted as described below.

(1) Measurement of Elastic Modulus of the Plate Surface

The elastic modulus of the plate surface was measured by using an ultramicro hardness meter "Nano Indenter XP" (manufactured by MTS Systems Corporation). A diamond conical indenter (radius of curvature of the edge, 50 μm) was pushed into the surface of the precursor for lithographic printing in an atmosphere at 25° C. to obtain a load-indentation depth curve. From the thus obtained load-indentation depth curve, complex elastic modulus E* (unit, MPa) including the contribution of the elastic deformation of the indenter was determined by using the following equation (1). When 14000 N/m² corresponding to the load applied to the plate surface during the development is reproduced in this measurement, P=0.11 mN (14000 N/m²×Π×(50 μm)²).

$$P = 4/3 \cdot E^* \cdot R^{1/2} \cdot h^{3/2} \qquad \text{equation (1)}$$

wherein R is radius (50 μm) of the indenter, P is load (0.11 mN), and h is displacement (nm). Units of the radius R, the load P, and the displacement h were adequately converted in the calculation of the complex elastic modulus E* (MPa).

Next, elastic modulus E (unit, MPa) of the sample was determined by using the following equation (2):

$$1/E^* = (1-v^2)/E + (1-vi^2)/Ei \qquad \text{equation (2)}$$

wherein v is Poisson's ratio (0.5) of the sample, E is elastic modulus (MPa) of the sample, vi is Poisson's ratio (0.07) of the indenter, and Ei is elastic modulus (1141×10³ MPa) of the indenter.

In the Examples of the present invention, the elastic modulus upon application of a load of 14000 N/m² corresponding to the load applied to the plate surface during the development on the ink repellent layer surface was calculated by equations (1) and (2) to thereby determine the elastic modulus of the plate surface.

(2) Measurement of Surface Roughness

Measurement of the surface roughness (arithmetic mean of the roughness Ra) was conducted by using a laser microscope "VK-9510" (manufactured by KEYENCE). Areas of 200 μm×200 μm on the surface of the lithographic printing plate were measured by using an objective lens (20×), and the average of the measurements at 10 positions was used for the surface roughness.

(3) Confirmation of the Composition of the Organic Layer

After embedding a piece of the precursor for lithographic printing in a resin, the resin was sliced to expose the crosssectional surface using crosssection polisher method (CP method), and the crosssectional surface was observed with a field emission scanning electron microscope (FE-SEM) to confirm the presence of the organic layer. In addition, when the organic layer is collected by peeling or grinding the upper layers and the collected organic layer is analyzed by pyrolysis GC-MS measurement, weight ratio of the each of polyurethane resin and the epoxy resin in the organic layer can be estimated. The measurement was conducted at a pyrolysis temperature of 500° C. using a GC column (0.25 mm (inner diameter)×30 m; stainless steel capillary column; stationary phase of 5% phenyl polydimethylsiloxane) at a temperature elevation condition of retaining at 50° C. for 3 minutes and elevating to 320° C. at 8° C./minute and at a flow rate of 1.5 ml/min and MS conditions of mass number (m/z) range of 10 to 800, and a scanning speed of 1 second per each scanning. The weight ratio of the each of polyurethane resin and the epoxy resin in the organic layer was calculated from the ratio of the strength of the isocyanate and polyol fragment peaks of the polyurethane resin and the ratio of the strength of the bisphenol skeleton fragment peak of the epoxy resin in relation to the total of all fragment peak strength.

(4) Quantitative Determination of Crosslink Density of the Addition-Type Silicone Rubber The crosslink density of the addition-type silicone rubber can be quantitatively determined by solid ²⁹Si NMR analysis. The silicone rubber was scraped from the precursor for lithographic printing, and the crosslink density was measured by solid ²⁹Si NMR by DD/MAS method using AVANCE 400 (manufactured by Bruker) under the conditions of measurement nucleus of ²⁹Si, spectrum width of 40 kHz, pulse width of 4.2 μsec, pulse repeat time of ACQTM (0.02049 sec) and PD (140 sec), observation point of 8192, using a standard substance of hexamethylcyclotrisiloxane (external standard, −9.66 ppm), at a temperature of 22° C., and sample rotation number of 4 kHz.

In the resulting ²⁹Si DD/MAS NMR spectrum, the peak near the chemical shift of −22 ppm was regarded to correspond to the Si* of the dimethylsiloxane unit represented by the following general formula (i) which is the base component of the silicone rubber, and the peak near 7 to 8 ppm was regarded to correspond to the Si* of the siloxane unit represented by the following general formula (ii) which is the crosslinking point.

Si—O—Si*(CH₃)₂—O—Si     (i)

—CH₂—Si*(CH₃)₂—O—Si     (ii)

The peak area ratio of (ii)/(i) (molar ratio of (ii) to (i)) as described above was calculated for use as the crosslink density.

(5) Quantitative Determination of Ink Repellent Liquid in the Ink Repellent Layer For the ink repellent layer, quantitative measurement of the ink repellent liquid can be conducted by the combination of weighing the extracted component and SEM observation of the crosssection. The liquid weight per unit area can be determined by immersing the precursor for lithographic printing in "ISOPAR" (Registered Trademark) E (manufactured by Esso Chemical) for 1 hour for extraction, and determining weight change before and after the immersion. The content of the ink repellent liquid in the ink repellent layer can be calculated by observing the crosssection of the precursor for lithographic printing with SEM to measure the thickness of the ink repellent layer, and assuming the specific weight of the ink repellent layer as 1. Since the platinum catalyst used in the Examples contains 94% by weight of the low molecular weight silicone, the amount extracted is higher than the intentionally added ink repelling component. The low molecular weight silicone included in the platinum catalyst functions as the ink repellent liquid.

(6) Measurement of Boiling Point of the Ink Repellent Liquid

In the present invention, the ink repellent liquid is defined to have a boiling point of 150° C. or higher when weight loss after leaving the liquid in an environment of 150° C. and 1 atmosphere for 1 hour is less than 0.5% by weight. In order to confirm the boiling point of the liquid used in the Examples, 2 g of the ink repellent liquid was weighed in an aluminum cup having a diameter of 50 mm and allowed to stand for 1 hour in an oven at 150° C., and then, the weight loss was determined. The ink repellent liquid was confirmed to have a boiling point of 150° C. or higher from the percentage of the weight loss.

(7) Production of Lithographic Printing Plate

The precursor for lithographic printing of the Examples was exposed by using a CTP plate recorder "PlateRite" 8800E (manufactured by Dainippon Screen Mfg., Co., Ltd.) under the conditions including an irradiation energy of 125 mJ/cm² (drum rotation number, 240 rpm). Exposure images of fine lines of 10 μm, fine lines of 6.4 μm, and belt-like solid image with the length of 20 mm and the width of 650 mm were provided at the center of the precursor for lithographic printing with the length of 550 mm and the width of 650 mm. The exposed precursor was passed through an automatic processor TWL-1160F (manufactured by Toray Industries, Inc.) at a speed of 80 cm/minute by using DP-1 (manufactured by Toray Industries, Inc.) for the pre-treatment liquid and tap water for the developer to produce a lithographic printing plate. The fine line image on the resulting lithographic printing plate was observed with a magnifier (100×) to measure distance of the lines reproduced. Proportion of the distance of the reproduced lines in the total length of the lines was determined for use as the image reproduction rate.

(8) UV Printing

A printing tester was prepared by connecting a UV irradiator with a built-in speed-variable conveyor to a delivery unit of a sheetfed press "OLIVER 266 EPZ" (manufactured by Sakurai Graphic Systems Corporation). The lithographic printing plate produced in the (7) above was mounted on the printing tester, and the UV printing test was conducted by using "SICURA Card 110N WA" (manufactured by Seigwerk, a UV-curable ink used in the application of security card printing) at a speed of 5000 sheets/hour (sph). The ink was supplied to the lithographic printing plate by an ink roller, and the lithographic printing plate was brought in contact with a blanket to thereby transfer the ink from the lithographic printing plate to the blanket. The ink on the blanket was then transferred to a thin coated paper serving as the printing substrate (offset printing). The amount of the UV ink supplied was controlled so that reflection density of the solid printing area was 1.6 (ink), and the printed material was obtained by irradiating the paper having the UV ink transferred thereto with the UV ray. The lamp used in the test was a metal halide lamp with an output of 120 W/cm$^2$, and the irradiation was conducted at a focal distance of 150 mm. The irradiation area was an area corresponding to the width (100 mm) of the lamp house in the flow direction.

(9) Measurement of Scumming Start Temperature

During the printing of the (8) above, the ink roller temperature was controlled by using a chiller to thereby change the plate surface temperature of the lithographic printing plate. The plate surface temperature was measured by using a non-contact thermometer. The scumming in the non-imaging areas was checked at each temperature.

(10) Measurement of Printable Number of Sheets Before Plate Wear

After measuring the scumming start temperature of the (9) above, the printing was continued with the temperature maintained at the scumming start temperature. The scumming state of the printed materials was checked at every 5000 sheets, and the number of sheets printed before visual confirmation of the scumming was used for the printable number of sheets before plate wear.

Example 1

A precursor for lithographic printing was prepared by the procedure as described below.

The solution of the composition for the organic layer as described below was coated on a degreased aluminum base having a thickness of 0.24 mm (manufactured by Mitsubisi Aluminum Co., Ltd.), and the coating was dried at 200° C. for 90 seconds to form an organic layer having a thickness of 6.0 µm. The solution of the composition for the organic layer was obtained by mixing and stirring the components as described below at room temperature.

<Solution of the Composition for the Organic Layer>

(a) a polymer having an active hydrogen: epoxy resin: "Epikote" (Registered Trademark) 1010 (manufactured by Japan Epoxy Resin): 29.2 parts by weight (b) a polymer having an active hydrogen: polyurethane: "SANPRENE" (Registered Trademark) LQ-T1331D (manufactured by Sanyo Chemical Industries, Ltd.; solid content concentration, 20% by weight): 51.7 parts by weight (c) an aluminum chelate: aluminum chelate ALCH-TR (manufactured by Kawaken Fine Chemicals Co., Ltd.): 4.5 parts by weight (d) a levelling agent: "DISPARLON" (Registered Trademark) LC951 (manufactured by Kusumoto Chemicals Ltd.; solid content, 10% by weight): 0.1 part by weight (e) titanium oxide: a dispersion of "TIPAQUE" (Registered Trademark) CR-50 (manufactured by Ishihara SangyoKaisha, Ltd.) in N,N-dimethylformamide (titanium oxide, 50% by weight): 14.5 parts by weight (f) N,N-dimethylformamide: 450 parts by weight (g) methyl ethyl ketone: 150 parts by weight.

The amount of each component blended in the solution of the composition for the organic layer is shown in parts by weight in relation to 100 parts by weight of the total of the components (a) to (e) blended.

Next, the solution of the composition for the heat sensitive layer as described above was coated on the organic layer, and the coating was dried by heating to 140° C. for 90 seconds to form a heat sensitive layer having a thickness of 1.5 µm. The solution of the composition for the heat sensitive layer was obtained by mixing and stirring the components as described below at room temperature.

<Solution of the Composition for the Heat Sensitive Layer>

(a) an infrared-absorbing dye: "PROJET" 825LDI (manufactured by Avecia): 13.8 parts by weight (b) an organic complex compound: titanium n-butoxide bis(acetylacetonate): "Nasem" (Registered Trademark) titanium (manufactured by Nihon Kagaku Sangyo Co., Ltd.; concentration, 73% by weight; containing 27% by weight of n-butanol as a solvent): 12.9 parts by weight (c) a phenol formaldehyde novolac resin: "Sumilite Resin" (Registered Trademark) PR53195 (manufactured by Sumitomo Bakelite Company Limited): 51.7 parts by weight (d) polyurethane: "Nippolan" (Registered Trademark) 5196 (manufactured by Nippon Polyurethane Industry Co., Ltd.; concentration, 30% by mass; containing 35% by weight of methyl ethyl ketone and 35% by weight of cyclohexanone as solvents): 21.6 parts by weight (e) tetrahydrofuran: 900 parts by weight The amount of each component blended in the solution of the composition for the heat sensitive layer is shown in parts by weight in relation to 100 parts by weight of the total of the components (a) to (d) blended.

Next, solution 1 of the composition for the ink repellent layer (silicone rubber layer) as described below prepared immediately before the coating was coated on the heat sensitive layer, and the coating was heated to 140° C. for 80 seconds to form an ink repellent layer having an average thickness of 2.0 µm to thereby obtain a precursor for lithographic printing. The solution 1 of the composition for the ink repellent layer was obtained by mixing and stirring the components as described below at room temperature.

<Solution 1 of the Composition for the Ink Repellent Layer>

(a) α,ω-silanol terminated polydimethylsiloxane: DMS-S51 (weight average molecular weight, 140,000; manufactured by GELEST Inc.): 92.89 parts by weight (b) vinyltris (methyethylketoxyimino)silane: 5.76 parts by weight (c) tetrakis(methyethylketoxyimino)silane: 1.32 parts by weight (d) dibutyl tin diacetate: 0.03 part by weight (e) "ISOPAR" (Registered Trademark) E (manufactured by Esso Chemical): 900 parts by weight Total amount of the components (a) to (d) blended in the solution 1 of the composition for the ink repellent layer is 100 parts by weight.

The resulting precursor for lithographic printing was evaluated for its physical properties of the plate surface by the procedures as described above. The elastic modulus of the plate surface was 30.5 MPa, and the surface roughness Ra was 0.45 μm. When this precursor was developed by the procedure as described above, the reproduction rate of the 10 μm fine line was 100%, and the reproduction rate of the 6.4 μm fine line was 60% indicating the high picture reproduction performance. When the printing test by the procedure as described above was conducted by using the resulting lithographic printing plate, the scumming start temperature was 24.0° C., and the printable number of sheets before plate wear was 50,000.

Example 2

The procedure of Example 1 was repeated except that the solution 1 of the composition for the ink repellent layer was replaced with the solution 2 of the composition for the ink repellent layer as described below to obtain a precursor for lithographic printing.

<Solution 2 of the Composition for the Ink Repellent Layer>

(a) α,ω-silanol terminated polydimethylsiloxane: TF15 (weight average molecular weight, 100,000; manufactured by Dow Corning Toray Co., Ltd.): 90.07 parts by weight (b) vinyltris(methyethylketoxyimino)silane: 8.05 parts by weight (c) tetrakis(methyethylketoxyimino)silane: 1.85 parts by weight (d) dibutyl tin diacetate: 0.03 part by weight (e) "ISOPAR" (Registered Trademark) E (manufactured by Esso Chemical): 900 parts by weight It is to be noted that the total of the components (a) to (d) of the solution 2 of the composition for the ink repellent layer is 100 parts by weight.

The resulting precursor for lithographic printing was evaluated for its physical properties of the plate surface by the procedures as described above. The elastic modulus of the plate surface was 32.4 MPa, and the surface roughness Ra was 0.35 μm. When this precursor was developed by the procedure as described above, the reproduction rate of the 10 μm fine line was 100%, and the reproduction rate of the 6.4 μm fine line was 95% indicating the high picture reproduction performance. When the printing test by the procedure as described above was conducted by using the resulting lithographic printing plate, the scumming start temperature was 24.0° C., and the printable number of sheets before plate wear was 70,000.

Example 3

The procedure of Example 1 was repeated except that the solution 1 of the composition for the ink repellent layer was replaced with the solution 3 of the composition for the ink repellent layer as described below to obtain a precursor for lithographic printing.

<Solution 3 of the Composition for the Ink Repellent Layer>

(a) α,ω-silanol terminated polydimethylsiloxane: TF15 (weight average molecular weight, 100,000; manufactured by Dow Corning Toray Co., Ltd.): 87.37 parts by weight (b) a hydrocarbon solvent: "Solvesso" 200 (surface tension, 36 mN/m; boiling point, >150° C.; manufactured by Exxon Mobil Corporation): 3.0 parts by weight (c) vinyltris(methyethylketoxyimino)silane: 7.81 parts by weight (d) tetrakis(methyethylketoxyimino)silane: 1.79 parts by weight (e) dibutyl tin diacetate: 0.03 part by weight (f) "ISOPAR" (Registered Trademark) E (manufactured by Esso Chemical): 900 parts by weight It is to be noted that the total of the components (a) to (e) of the solution 3 of the composition for the ink repellent layer is 100 parts by weight.

The resulting precursor for lithographic printing was evaluated for its physical properties of the plate surface by the procedures as described above. The elastic modulus of the plate surface was 30.4 MPa, and the surface roughness Ra was 0.37 μm. When this precursor was developed by the procedure as described above, the reproduction rate of the 10 μm fine line was 100%, and the reproduction rate of the 6.4 μm fine line was 90%, indicating the high picture reproduction performance. When the printing test by the procedure as described above was conducted by using the resulting lithographic printing plate, the scumming start temperature was 25.0° C., and the printable number of sheets before plate wear was 70,000.

Example 4

The procedure of Example 1 was repeated except that the solution 1 of the composition for the ink repellent layer was replaced with the solution 4 of the composition for the ink repellent layer as described below to obtain a precursor for lithographic printing.

<Solution 4 of the Composition for the Ink Repellent Layer>

(a) α,ω-silanol terminated polydimethylsiloxane: TF15 (weight average molecular weight, 100,000; manufactured by Dow Corning Toray Co., Ltd.): 87.37 parts by weight (b) a hydrocarbon solvent: "Solvesso" (Registered Trademark) 100 (surface tension, 29 mN/m; boiling point, >150° C.; manufactured by Exxon Mobil Corporation): 3.0 parts by weight (c) vinyltris(methyethylketoxyimino)silane: 7.81 parts by weight (d) tetrakis(methyethylketoxyimino)silane: 1.79 parts by weight (e) dibutyl tin diacetate: 0.03 part by weight (f) "ISOPAR" (Registered Trademark) E (manufactured by Esso Chemical): 900 parts by weight It is to be noted that the total of the components (a) to (e) of the solution 4 of the composition for the ink repellent layer is 100 parts by weight.

The resulting precursor for lithographic printing was evaluated for its physical properties of the plate surface by the procedures as described above. The elastic modulus of the plate surface was 29.4 MPa, and the surface roughness Ra was 0.37 μm. When this precursor was developed by the procedure as described above, the reproduction rate of the 10 μm fine line was 100%, and the reproduction rate of the 6.4 μm fine line was 90% indicating the high picture reproduction performance. When the printing test by the procedure as described above was conducted by using the resulting lithographic printing plate, the scumming start temperature was 26.0° C., and the printable number of sheets before plate wear was 70,000.

Example 5

The procedure of Example 1 was repeated except that the solution 1 of the composition for the ink repellent layer was replaced with the solution 5 of the composition for the ink repellent layer as described below to obtain a precursor for lithographic printing.

<Solution 5 of the Composition for the Ink Repellent Layer>

(a) α,ω-silanol terminated polydimethylsiloxane: TF1 (weight average molecular weight, 60,000; manufactured by Dow Corning Toray Co., Ltd.): 71.07 parts by weight (b) a hydrocarbon solvent: "Solvesso" (Registered Trademark) 100 (surface tension, 29 mN/m; boiling point, >150° C.; manufactured by Exxon Mobil Corporation): 15.0 parts by weight (c) vinyltris(methyethylketoxyimino)silane: 11.31 parts by weight (d) tetrakis(methyethylketoxyimino)silane: 2.59 parts by weight (e) dibutyl tin diacetate: 0.03 part by weight (f) "ISOPAR" (Registered Trademark) E (manufactured by Esso Chemical): 900 parts by weight It is to be noted that the total of the components (a) to (e) of the solution 5 of the composition for the ink repellent layer is 100 parts by weight.

The resulting precursor for lithographic printing was evaluated for its physical properties of the plate surface by the procedures as described above. The elastic modulus of the plate surface was 25.0 MPa, and the surface roughness Ra was 0.40 µm. When this precursor was developed by the procedure as described above, the reproduction rate of the 10 µm fine line was 100%, and the reproduction rate of the 6.4 µm fine line was 85% indicating the high picture reproduction performance. When the printing test by the procedure as described above was conducted by using the resulting lithographic printing plate, the scumming start temperature was 31.0° C., and the printable number of sheets before plate wear was 80,000.

Example 6

The procedure of Example 1 was repeated except that the solution 1 of the composition for the ink repellent layer was replaced with the solution 6 of the composition for the ink repellent layer as described below to obtain a precursor for lithographic printing.

<Solution 6 of the Composition for the Ink Repellent Layer>

(a) α,ω-silanol terminated polydimethylsiloxane: TF1 (weight average molecular weight, 60,000; manufactured by Dow Corning Toray Co., Ltd.): 78.77 parts by weight (b) a hydrocarbon solvent: "Solvesso" (Registered Trademark) 100 (surface tension, 29 mN/m; boiling point, >150° C.; manufactured by Exxon Mobil Corporation): 5.8 parts by weight (c) vinyltris(methyethylketoxyimino)silane: 12.53 parts by weight (d) tetrakis(methyethylketoxyimino)silane: 2.87 parts by weight (e) dibutyl tin diacetate: 0.03 part by weight (f) "ISOPAR" (Registered Trademark) E (manufactured by Esso Chemical): 900 parts by weight It is to be noted that the total of the components (a) to (e) of the solution 6 of the composition for the ink repellent layer is 100 parts by weight.

The resulting precursor for lithographic printing was evaluated for its physical properties of the plate surface by the procedures as described above. The elastic modulus of the plate surface was 34.5 MPa, and the surface roughness Ra was 0.34 µm. When this precursor was developed by the procedure as described above, the reproduction rate of the 10 µm fine line was 100%, and the reproduction rate of the 6.4 µm fine line was 100%, indicating the very high picture reproduction performance. When the printing test by the procedure as described above was conducted by using the resulting lithographic printing plate, the scumming start temperature was 26.5° C., and the printable number of sheets before plate wear was 80,000.

Example 7

The procedure of Example 1 was repeated except that the solution 1 of the composition for the ink repellent layer was replaced with the solution 7 of the composition for the ink repellent layer as described below to obtain a precursor for lithographic printing.

<Solution 7 of the Composition for the Ink Repellent Layer>

(a) α,ω-silanol terminated polydimethylsiloxane: TF1 (weight average molecular weight, 60,000; manufactured by Dow Corning Toray Co., Ltd.): 78.77 parts by weight (b) a silicone oil: KF-96-50cs (polydimethylsiloxane terminated with methyl group at opposite ends; weight average molecular weight, 3780; surface tension, 20.8 mN/m; boiling point, >150° C.; manufactured by Shin-Etsu Chemical Co., Ltd.): 5.8 parts by weight (c) vinyltris(methyethylketoxyimino)silane: 12.53 parts by weight (d) tetrakis(methyethylketoxyimino)silane: 2.87 parts by weight (e) dibutyl tin diacetate: 0.03 part by weight (f) "ISOPAR" (Registered Trademark) E (manufactured by Esso Chemical): 900 parts by weight It is to be noted that the total of the components (a) to (e) of the solution 7 of the composition for the ink repellent layer is 100 parts by weight.

The resulting precursor for lithographic printing was evaluated for its physical properties of the plate surface by the procedures as described above. The elastic modulus of the plate surface was 34.2 MPa, and the surface roughness Ra was 0.34 µm. When this precursor was developed by the procedure as described above, the reproduction rate of the 10 µm fine line was 100%, and the reproduction rate of the 6.4 µm fine line was 100%, indicating the very high picture reproduction performance. When the printing test by the procedure as described above was conducted by using the resulting lithographic printing plate, the scumming start temperature was 27.0° C., and the printable number of sheets before plate wear was 80,000.

Example 8

The procedure of Example 1 was repeated except that the solution 1 of the composition for the ink repellent layer was replaced with the solution 8 of the composition for the ink repellent layer as described below to obtain a precursor for lithographic printing.

<Solution 8 of the Composition for the Ink Repellent Layer>

(a) α, ω-divinyl polydimethylsiloxane: DMS-V35 (weight average molecular weight, 49,500; manufactured by GELEST Inc.): 86.7 parts by weight (b) a methyl hydrogen polysiloxane SH1107 ((I)/(I)+(II)= 1.0; manufactured by Dow Corning Toray Co., Ltd.): 4.49 parts by weight (c) vinyltris(methyethylketoxyimino)silane: 2.64 parts by weight (d) a platinum catalyst SRX212 (manufactured by Dow Corning Toray Co., Ltd.; containing 6.0% by weight of the platinum catalyst): 6.17 parts by weight (the ink repelling liquid constituting 5.8 parts by weight)

(e) "ISOPAR" E (manufactured by Esso Chemical): 900 parts by weight

It is to be noted that the total of the components (a) to (d) of the solution 8 of the composition for the ink repellent layer is 100 parts by weight. With regard to the methyl hydrogen polysiloxane SH1107 (b), content of the siloxane structural unit represented by the general formula (I) in relation to total (100% by mole) of the siloxane structural unit represented by the general formula (I) and the siloxane structural unit represented by the general formula (II) is 100% by mole. Molar ratio of number of the SiH groups in the SH1107 (b) to number of the vinyl groups in the DMS-V35 (a) (number of the SiH groups/number of the vinyl groups) is 8.0.

The resulting precursor for lithographic printing was evaluated for its physical properties of the plate surface by the procedures as described above. The elastic modulus of the plate surface was 34.2 MPa, and the surface roughness Ra was 0.28 µm. When this precursor was developed by the procedure as described above, the reproduction rate of the 10 µm fine line was 100%, and the reproduction rate of the 6.4 µm fine line was 100%, indicating the very high picture reproduction performance. When the printing test by the procedure as described above was conducted by using the resulting lithographic printing plate, the scumming start temperature was 26.4° C., and the printable number of sheets before plate wear was 70,000.

Example 9

The procedure of Example 1 was repeated except that the solution 1 of the composition for the ink repellent layer was replaced with the solution 9 of the composition for the ink repellent layer as described below to obtain a precursor for lithographic printing.

<Solution 9 of the Composition for the Ink Repellent Layer>

(a) α,ω-divinyl polydimethylsiloxane: DMS-V35 (weight average molecular weight, 49,500; manufactured by GELEST Inc.): 84.81 parts by weight (b) a silicone oil: KF-96-50cs (weight average molecular weight, 3,780; surface tension, 20.8 mN/m; boiling point, > 150° C.; manufactured by Shin-Etsu Chemical Co., Ltd.): 4.2 parts by weight (c) a methyl hydrogen siloxane-dimethylsiloxane copolymer HMS-301 ((I)/(I)+(II)=0.3; manufactured by GELEST Inc.): 2.18 parts by weight (d) vinyltris(methyethylketoxyimino)silane: 2.64 parts by weight (e) a platinum catalyst SRX212 (manufactured by Dow Corning Toray Co., Ltd.; containing 6.0% by weight of the platinum catalyst): 6.17 parts by weight (the ink repelling liquid constituting 5.8 parts by weight)

(f) "ISOPAR" E (manufactured by Esso Chemical): 900 parts by weight

It is to be noted that the total of the components (a) to (e) of the solution 9 of the composition for the ink repellent layer is 100 parts by weight. With regard to the methyl hydrogen siloxane-dimethylsiloxane copolymer HMS-301 (c), content of the siloxane structural unit represented by the general formula (I) in relation to total (100% by mole) of the siloxane structural unit represented by the general formula (I) and the siloxane structural unit represented by the general formula (II) is 30% by mole. Molar ratio of number of the SiH groups in the HMS-301 (c) to number of the vinyl groups in the DMS-V35 (a) (number of the SiH groups/number of the vinyl groups) is 1.1.

The resulting precursor for lithographic printing was evaluated for its physical properties of the plate surface by the procedures as described above. The elastic modulus of the plate surface was 26.1 MPa, and the surface roughness Ra was 0.34 µm. When this precursor was developed by the procedure as described above, the reproduction rate of the 10 µm fine line was 100%, and the reproduction rate of the 6.4 µm fine line was 100%, indicating the very high picture reproduction performance. When the printing test by the procedure as described above was conducted by using the resulting lithographic printing plate, the scumming start temperature was 30.0° C., and the printable number of sheets before plate wear was 70,000.

Example 10

The procedure of Example 1 was repeated except that the solution 1 of the composition for the ink repellent layer was replaced with the solution 10 of the composition for the ink repellent layer as described below to obtain a precursor for lithographic printing.

<Solution 10 of the Composition for the Ink Repellent Layer>

(a) α,ω-divinyl polydimethylsiloxane: DMS-V35 (weight average molecular weight, 49,500; manufactured by GELEST Inc.): 79.08 parts by weight (b) a silicone oil: KF-96-50cs (weight average molecular weight, 3,780; surface tension, 20.8 mN/m; boiling point, > 150° C.; manufactured by Shin-Etsu Chemical Co., Ltd.): 4.2 parts by weight (c) a methyl hydrogen siloxane-dimethylsiloxane copolymer RD-1 ((I)/(I)+(II)=0.5; manufactured by Dow Corning Toray Co., Ltd.): 7.91 parts by weight (d) vinyltris(methyethylketoxyimino)silane: 2.64 parts by weight (e) a platinum catalyst SRX212 (manufactured by Dow Corning Toray Co., Ltd.; containing 6.0% by weight of the platinum catalyst): 6.17 parts by weight (the ink repelling liquid constituting 5.8 parts by weight)

(f) "ISOPAR" E (manufactured by Esso Chemical): 900 parts by weight

It is to be noted that the total of the components (a) to (e) of the solution 10 of the composition for the ink repellent layer is 100 parts by weight. With regard to methyl hydrogen siloxane-dimethylsiloxane copolymer RD-1 (c), content of the siloxane structural unit represented by the general formula (I) in relation to total (100% by mole) of the siloxane structural unit represented by the general formula (I) and the siloxane structural unit represented by the general formula (II) is 50% by mole. Molar ratio of number of the SiH groups in the RD-1 (c) to the number of vinyl groups in the DMS-V35 (a) (number of the SiH groups/number of the vinyl groups) is 7.0.

The resulting precursor for lithographic printing was evaluated for its physical properties of the plate surface by the procedures as described above. The elastic modulus of the plate surface was 32.0 MPa, and the surface roughness Ra was 0.29 µm. When this precursor was developed by the procedure as described above, the reproduction rate of the 10 µm fine line was 100%, and the reproduction rate of the 6.4 µm fine line was 100%, indicating the very high picture reproduction performance. When the printing test by the procedure as described above was conducted by using the resulting lithographic printing plate, the scumming start temperature was 28.6° C., and the printable number of sheets before plate wear was 80,000.

Example 11

The procedure of Example 1 was repeated except that the solution 1 of the composition for the ink repellent layer was replaced with the solution 11 of the composition for the ink repellent layer as described below to obtain a precursor for lithographic printing.

<Solution 11 of the Composition for the Ink Repellent Layer>

(a) α,ω-divinyl polydimethylsiloxane: DMS-V35 (weight average molecular weight, 49,500; manufactured by GELEST Inc.): 85.65 parts by weight (b) a silicone oil: KF-96-50cs (weight average molecular weight, 3,780; surface tension, 20.8 mN/m; boiling point, > 150° C.; manufactured by Shin-Etsu Chemical Co., Ltd.): 4.2 parts by weight (c) a methyl hydrogen siloxane-dimethylsiloxane copolymer RD-1 ((I)/(I)+(II)=0.5; manufactured by Dow Corning Toray Co., Ltd.): 1.34 parts by weight (d) vinyltris(methyethylketoxyimino)silane: 2.64 parts by weight (e) a platinum catalyst SRX212 (manufactured by Dow Corning Toray Co., Ltd.; containing 6.0% by weight of the platinum catalyst): 6.17 parts by weight (the ink repelling liquid constituting 5.8 parts by weight)

(f) "ISOPAR" E (manufactured by Esso Chemical): 900 parts by weight

It is to be noted that the total of the components (a) to (e) of the solution 11 of the composition for the ink repellent layer is 100 parts by weight. With regard to the methyl hydrogen siloxane-dimethylsiloxane copolymer RD-1 (c), content of the siloxane structural unit represented by the general formula (I) in relation to total (100% by mole) of the siloxane structural unit represented by the general formula (I) and the siloxane structural unit represented by the general formula (II) is 50% by mole. Molar ratio of number of the SiH groups in the RD-1 (c) to the number of vinyl groups in the DMS-V35 (a) (number of the SiH groups/number of the vinyl groups) is 1.1.

The resulting precursor for lithographic printing was evaluated for its physical properties of the plate surface by the procedures as described above. The elastic modulus of the plate surface was 26.1 MPa, and the surface roughness Ra was 0.34 μm. When this precursor was developed by the procedure as described above, the reproduction rate of the 10 μm fine line was 100%, and the reproduction rate of the 6.4 μm fine line was 100%, indicating the very high picture reproduction performance. When the printing test by the procedure as described above was conducted by using the resulting lithographic printing plate, the scumming start temperature was 30.0° C., and the printable number of sheets before plate wear was 70,000.

Example 12

The procedure of Example 1 was repeated except that the solution 1 of the composition for the ink repellent layer was replaced with the solution 12 of the composition for the ink repellent layer as described below to obtain a precursor for lithographic printing.

<Solution 12 of the Composition for the Ink Repellent Layer>

(a) α,ω-divinyl polydimethylsiloxane: DMS-V35 (weight average molecular weight, 49,500; manufactured by GELEST Inc.): 84.57 parts by weight (b) a silicone oil: KF-96-50cs (weight average molecular weight, 3,780; surface tension, 20.8 mN/m; boiling point, > 150° C.; manufactured by Shin-Etsu Chemical Co., Ltd.): 4.2 parts by weight (c) a methyl hydrogen siloxane-dimethylsiloxane copolymer RD-1 ((I)/(I)+(II)=0.5; manufactured by DowCorning Toray Co., Ltd.): 2.42 parts by weight (d) vinyltris(methyethylketoxyimino)silane: 2.64 parts by weight (e) a platinum catalyst SRX212 (manufactured by Dow Corning Toray Co., Ltd.; containing 6.0% by weight of the platinum catalyst): 6.17 parts by weight (the ink repelling liquid constituting 5.8 parts by weight)

(f) "ISOPAR" E (manufactured by Esso Chemical): 900 parts by weight

It is to be noted that the total of the components (a) to (e) of the solution 12 of the composition for the ink repellent layer is 100 parts by weight. With regard to the methyl hydrogen siloxane-dimethylsiloxane copolymer RD-1 (c), content of the siloxane structural unit represented by the general formula (I) in relation to total (100% by mole) of the siloxane structural unit represented by the general formula (I) and the siloxane structural unit represented by the general formula (II) is 50% by mole. Molar ratio of number of the SiH groups in the RD-1 (c) to the number of vinyl groups in the DMS-V35 (a) (number of the SiH groups/number of the vinyl groups) is 2.0.

The resulting precursor for lithographic printing was evaluated for its physical properties of the plate surface by the procedures as described above. The elastic modulus of the plate surface was 27.0 MPa, and the surface roughness Ra was 0.34 μm. When this precursor was developed by the procedure as described above, the reproduction rate of the 10 μm fine line was 100%, and the reproduction rate of the 6.4 μm fine line was 100%, indicating the very high picture reproduction performance. When the printing test by the procedure as described above was conducted by using the resulting lithographic printing plate, the results were favorable with the scumming start temperature of 29.8° C. and the printable number of sheets before plate wear of 90,000.

Example 13

The procedure of Example 1 was repeated except that the solution 1 of the composition for the ink repellent layer was replaced with the solution 13 of the composition for the ink repellent layer as described below to obtain a precursor for lithographic printing.

<Solution 13 of the Composition for the Ink Repellent Layer>

(a) α,ω-divinyl polydimethylsiloxane: DMS-V35 (weight average molecular weight, 49,500; manufactured by GELEST Inc.): 82.85 parts by weight (b) a silicone oil: KF-96-50cs (weight average molecular weight, 3,780; surface tension, 20.8 mN/m; boiling point, > 150° C.; manufactured by Shin-Etsu Chemical Co., Ltd.): 4.2 parts by weight (c) a methyl hydrogen siloxane-dimethylsiloxane copolymer RD-1 ((I)/(I)+(II)=0.5; manufactured by Dow Corning Toray Co., Ltd.): 4.14 parts by weight (d) vinyltris(methyethylketoxyimino)silane: 2.64 parts by weight (e) a platinum catalyst SRX212 (manufactured by Dow Corning Toray Co., Ltd.; containing 6.0% by weight of the platinum catalyst): 6.17 parts by weight (the ink repelling liquid constituting 5.8 parts by weight)

(f) "ISOPAR" E (manufactured by Esso Chemical): 900 parts by weight

It is to be noted that the total of the components (a) to (e) of the solution 13 of the composition for the ink repellent layer is 100 parts by weight. With regard to the methyl hydrogen siloxane-dimethylsiloxane copolymer RD-1, content of the siloxane structural unit represented by the general formula (I) in relation to total (100% by mole) of the siloxane structural unit represented by the general formula (I) and the siloxane structural unit represented by the general formula (II) is 50% by mole. Molar ratio of number of the SiH groups in the RD-1 (c) to the number of vinyl groups in the DMS-V35 (a) (number of the SiH groups/number of the vinyl groups) is 3.5.

The resulting precursor for lithographic printing was evaluated for its physical properties of the plate surface by the procedures as described above. The elastic modulus of the plate surface was 28.5 MPa, and the surface roughness Ra was 0.32 μm. When this precursor was developed by the procedure as described above, the reproduction rate of the 10 μm fine line was 100%, and the reproduction rate of the 6.4 μm fine line was 100%, indicating the very high picture reproduction performance. When the printing test by the procedure as described above was conducted by using the resulting lithographic printing plate, the results were favorable with the scumming start temperature of 29.5° C. and the printable number of sheets before plate wear of 100,000.

Example 14

The procedure of Example 1 was repeated except that the solution 1 of the composition for the ink repellent layer was replaced with the solution 14 of the composition for the ink repellent layer as described below to obtain a precursor for lithographic printing.
<Solution 14 of the Composition for the Ink Repellent Layer>

(a) α,ω-divinyl polydimethylsiloxane: DMS-V35 (weight average molecular weight, 49,500; manufactured by GELEST Inc.): 80.12 parts by weight (b) a silicone oil: KF-96-50cs (weight average molecular weight, 3,780; surface tension, 20.8 mN/m; boiling point, > 150° C.; manufactured by Shin-Etsu Chemical Co., Ltd.): 4.2 parts by weight (c) a methyl hydrogen siloxane-dimethylsiloxane copolymer RD-1 ((I)/(I)+(II)=0.5; manufactured by Dow Corning Toray Co., Ltd.): 6.87 parts by weight (d) vinyltris(methyethylketoxyimino)silane: 2.64 parts by weight (e) a platinum catalyst SRX212 (manufactured by Dow Corning Toray Co., Ltd.; containing 6.0% by weight of the platinum catalyst): 6.17 parts by weight (the ink repelling liquid constituting 5.8 parts by weight)

(f) "ISOPAR" E (manufactured by Esso Chemical): 900 parts by weight

It is to be noted that the total of the components (a) to (e) of the solution 14 of the composition for the ink repellent layer is 100 parts by weight. With regard to the methyl hydrogen siloxane-dimethylsiloxane copolymer RD-1 (c), content of the siloxane structural unit represented by the general formula (I) in relation to total (100% by mole) of the siloxane structural unit represented by the general formula (I) and the siloxane structural unit represented by the general formula (II) is 50% by mole. Molar ratio of number of the SiH groups in the RD-1 (c) to the number of vinyl groups in the DMS-V35 (a) (number of the SiH groups/number of the vinyl groups) is 6.0.

The resulting precursor for lithographic printing was evaluated for its physical properties of the plate surface by the procedures as described above. The elastic modulus of the plate surface was 31.0 MPa, and the surface roughness Ra was 0.30 μm. When this precursor was developed by the procedure as described above, the reproduction rate of the 10 μm fine line was 100%, and the reproduction rate of the 6.4 μm fine line was 100%, indicating the very high picture reproduction performance. When the printing test by the procedure as described above was conducted by using the resulting lithographic printing plate, the results were favorable with the scumming start temperature of 29.0° C. and the printable number of sheets before plate wear of 100,000.

Example 15

The procedure of Example 1 was repeated except that the solution 1 of the composition for the ink repellent layer was replaced with the solution 15 of the composition for the ink repellent layer as described below to obtain a precursor for lithographic printing.
<Solution 15 of the Composition for the Ink Repellent Layer>

(a) α,ω-divinyl polydimethylsiloxane: DMS-V35 (weight average molecular weight, 49,500; manufactured by GELEST Inc.): 86.26 parts by weight (b) a methyl hydrogen siloxane-dimethylsiloxane copolymer RD-1 ((I)/(I)+(II)=0.5; manufactured by Dow Corning Toray Co., Ltd.): 4.93 parts by weight (c) vinyltris(methyethylketoxyimino)silane: 2.64 parts by weight (d) a platinum catalyst SRX212 (manufactured by Dow Corning Toray Co., Ltd.; containing 6.0% by weight of the platinum catalyst): 6.17 parts by weight (the ink repelling liquid constituting 5.8 parts by weight)

(e) "ISOPAR" E (manufactured by Esso Chemical): 900 parts by weight

It is to be noted that the total of the components (a) to (d) of the solution 15 of the composition for the ink repellent layer is 100 parts by weight. With regard to the methyl hydrogen siloxane-dimethylsiloxane copolymer RD-1 (b), content of the siloxane structural unit represented by the general formula (I) in relation to total (100% by mole) of the siloxane structural unit represented by the general formula (I) and the siloxane structural unit represented by the general formula (II) is 50% by mole. Molar ratio of number of the SiH groups in the RD-1 (b) to the number of vinyl groups in the DMS-V35 (a) (number of the SiH groups/number of the vinyl groups) is 4.0.

The resulting precursor for lithographic printing was evaluated for its physical properties of the plate surface by the procedures as described above. The elastic modulus of the plate surface was 33.2 MPa, and the surface roughness Ra was 0.29 μm. When this precursor was developed by the procedure as described above, the reproduction rate of the 10 μm fine line was 100%, and the reproduction rate of the 6.4 μm fine line was 100%, indicating the very high picture reproduction performance. When the printing test by the procedure as described above was conducted by using the resulting lithographic printing plate, the results were favorable with the scumming start temperature of 27.4° C., and the printable number of sheets before plate wear of 100,000.

Example 16

The procedure of Example 1 was repeated except that the solution 1 of the composition for the ink repellent layer was replaced with the solution 16 of the composition for the ink repellent layer as described below to obtain a precursor for lithographic printing.

<Solution 16 of the Composition for the Ink Repellent Layer>

(a) α,ω-divinyl polydimethylsiloxane: DMS-V35 (weight average molecular weight, 49,500; manufactured by GELEST Inc.): 77.66 parts by weight (b) a silicone oil: KF-96-50cs (weight average molecular weight, 3,780; surface tension, 20.8 mN/m; boiling point, > 150° C.; manufactured by Shin-Etsu Chemical Co., Ltd.): 8.2 parts by weight (c) a methyl hydrogen siloxane-dimethylsiloxane copolymer RD-1 ((I)/(I)+(II)=0.5; manufactured by Dow Corning Toray Co., Ltd.): 5.33 parts by weight (d) vinyltris(methyethylketoxyimino)silane: 2.64 parts by weight (e) a platinum catalyst SRX212 (manufactured by Dow Corning Toray Co., Ltd.; containing 6.0% by weight of the platinum catalyst): 6.17 parts by weight (the ink repelling liquid constituting 5.8 parts by weight)

(f) "ISOPAR" E (manufactured by Esso Chemical): 900 parts by weight

It is to be noted that the total of the components (a) to (e) of the solution 16 of the composition for the ink repellent layer is 100 parts by weight. With regard to the methyl hydrogen siloxane-dimethylsiloxane copolymer RD-1 (c), content of the siloxane structural unit represented by the general formula (I) in relation to total (100% by mole) of the siloxane structural unit represented by the general formula (I) and the siloxane structural unit represented by the general formula (II) is 50% by mole. Molar ratio of number of the SiH groups in the RD-1 (c) to the number of vinyl groups in the DMS-V35 (a) (number of the SiH groups/number of the vinyl groups) is 4.8.

The resulting precursor for lithographic printing was evaluated for its physical properties of the plate surface by the procedures as described above. The elastic modulus of the plate surface was 25.8 MPa, and the surface roughness Ra was 0.33 μm. When this precursor was developed by the procedure as described above, the reproduction rate of the 10 μm fine line was 100%, and the reproduction rate of the 6.4 μm fine line was 100%, indicating the very high picture reproduction performance. When the printing test by the procedure as described above was conducted by using the resulting lithographic printing plate, the results were favorable with the scumming start temperature of 31.2° C. and the printable number of sheets before plate wear of 90,000.

Example 17

The procedure of Example 1 was repeated except that the solution 1 of the composition for the ink repellent layer was replaced with the solution 17 of the composition for the ink repellent layer as described below to obtain a precursor for lithographic printing.

<Solution 17 of the Composition for the Ink Repellent Layer>

(a) α,ω-divinyl polydimethylsiloxane: TF22 (weight average molecular weight, 100,000; manufactured by Dow Corning Toray Co., Ltd.): 83.00 parts by weight (b) a silicone oil: KF-96-50cs (weight average molecular weight, 3,780; surface tension, 20.8 mN/m; boiling point, > 150° C.; manufactured by Shin-Etsu Chemical Co., Ltd.): 4.2 parts by weight (c) a methyl hydrogen siloxane-dimethylsiloxane copolymer RD-1 ((I)/(I)+(II)=0.5; manufactured by Dow Corning Toray Co., Ltd.): 3.99 parts by weight (d) vinyltris(methyethylketoxyimino)silane: 2.64 parts by weight (e) a platinum catalyst SRX212 (manufactured by Dow Corning Toray Co., Ltd.; containing 6.0% by weight of the platinum catalyst): 6.17 parts by weight (the ink repelling liquid constituting 5.8 parts by weight)

(f) "ISOPAR" E (manufactured by Esso Chemical): 900 parts by weight

It is to be noted that the total of the components (a) to (e) of the solution 17 of the composition for the ink repellent layer is 100 parts by weight. With regard to the methyl hydrogen siloxane-dimethylsiloxane copolymer RD-1 (c), content of the siloxane structural unit represented by the general formula (I) in relation to total (100% by mole) of the siloxane structural unit represented by the general formula (I) and the siloxane structural unit represented by the general formula (II) is 50% by mole. Molar ratio of number of the SiH groups in the RD-1 (c) to number of vinyl groups in the TF22 (a) (number of the SiH groups/number of the vinyl groups) is 6.0.

The resulting precursor for lithographic printing was evaluated for its physical properties of the plate surface by the procedures as described above. The elastic modulus of the plate surface was 28.4 MPa, and the surface roughness Ra was 0.35 μm. When this precursor was developed by the procedure as described above, the reproduction rate of the 10 μm fine line was 100%, and the reproduction rate of the 6.4 μm fine line was 95% indicating the high picture reproduction performance. When the printing test by the procedure as described above was conducted by using the resulting lithographic printing plate, the scumming start temperature was 29.0° C., and the printable number of sheets before plate wear was 70,000.

Comparative Example 1

The procedure of Example 1 was repeated except that the solution 1 of the composition for the ink repellent layer was replaced with the solution 18 of the composition for the ink repellent layer as described below to obtain a precursor for lithographic printing.

<Solution 18 of the Composition for the Ink Repellent Layer>

(a) α,ω-silanol terminated polydimethylsiloxane: DMS-S51 (weight average molecular weight, 140,000; manufactured by GELEST Inc.): 78.97 parts by weight (b) a silicone oil: KF-96-50cs (weight average molecular weight, 3,780; surface tension, 20.8 mN/m; boiling point, > 150° C.; manufactured by Shin-Etsu Chemical Co., Ltd.): 15.0 parts by weight (c) vinyltris(methyethylketoxyimino)silane: 4.88 parts by weight (d) tetrakis(methyethylketoxyimino)silane: 1.12 parts by weight (e) dibutyl tin diacetate: 0.03 part by weight (f) "ISOPAR" (Registered Trademark) E (manufactured by Esso Chemical): 900 parts by weight It is to be noted that the total of the components (a) to (e) of the solution 18 of the composition for the ink repellent layer is 100 parts by weight.

The resulting precursor for lithographic printing was evaluated for its physical properties of the plate surface by the procedures as described above. The elastic modulus of the plate surface was 15.5 MPa, and the surface roughness Ra was 0.54 µm. When this precursor was developed by the procedure as described above, the reproduction rate of the 10 µm fine line was 40%, and the reproduction rate of the 6.4 µm fine line was 0%, and insufficient picture reproducibility was thereby indicated. When the printing test by the procedure as described above was conducted by using the resulting lithographic printing plate, the scumming start temperature was 30.0° C., and the printable number of sheets before plate wear was 5,000.

Comparative Example 2

The procedure of Example 1 was repeated except that the solution 1 of the composition for the ink repellent layer was replaced with the solution 19 of the composition for the ink repellent layer as described below to obtain a precursor for lithographic printing.

<Solution 19 of the Composition for the Ink Repellent Layer>

(a) α,ω-divinyl polydimethylsiloxane: DMS-V35 (weight average molecular weight, 49,500; manufactured by GELEST Inc.): 76.50 parts by weight (b) a silicone oil: KF-96-50cs (weight average molecular weight, 3,780; surface tension, 20.8 mN/m; boiling point, > 150° C.; manufactured by Shin-Etsu Chemical Co., Ltd.): 14.2 parts by weight (c) a methyl hydrogen polysiloxane SH1107 ((I)/(I)+(II)= 1.0; manufactured by Dow Corning Toray Co., Ltd.): 0.49 part by weight (d) vinyltris(methylethylketoxyimino)silane: 2.64 parts by weight (e) a platinum catalyst SRX212 (manufactured by Dow Corning Toray Co., Ltd.; containing 6.0% by weight of the platinum catalyst): 6.17 parts by weight (the ink repelling liquid constituting 5.8 parts by weight)

(f) "ISOPAR" E (manufactured by Esso Chemical): 900 parts by weight

It is to be noted that the total of the components (a) to (e) of the solution 19 of the composition for the ink repellent layer is 100 parts by weight. With regard to the methyl hydrogen polysiloxane SH1107 (c), content of the siloxane structural unit represented by the general formula (I) in relation to total (100% by mole) of the siloxane structural unit represented by the general formula (I) and the siloxane structural unit represented by the general formula (II) is 100% by mole. Molar ratio of number of the SiH groups in the methyl hydrogen polysiloxane SH1107 (c) to number of the vinyl groups in the DMS-V35 (a) (number of the SiH groups/number of the vinyl groups) is 1.0.

The resulting precursor for lithographic printing was evaluated for its physical properties of the plate surface by the procedures as described above. The elastic modulus of the plate surface was 16.0 MPa, and the surface roughness Ra was 0.41 µm. When this precursor was developed by the procedure as described above, the reproduction rate of the 10 µm fine line was 50%, and the reproduction rate of the 6.4 µm fine line was 10%, and insufficient picture reproducibility was thereby indicated. When the printing test by the procedure as described above was conducted by using the resulting lithographic printing plate, the scumming start temperature was 33.0° C., and the printable number of sheets before plate wear was 5,000.

Comparative Example 3

The procedure of Example 1 was repeated except that the solution 1 of the composition for the ink repellent layer was replaced with the solution 20 of the composition for the ink repellent layer as described below to obtain a precursor for lithographic printing.

<Solution 20 of the Composition for the Ink Repellent Layer>

(a) α,ω-divinyl polydimethylsiloxane: DMS-V52 (weight average molecular weight, 150,000; manufactured by GELEST Inc.): 88.54 parts by weight (b) a methyl hydrogen polysiloxane SH1107 ((I)/(I)+(II)= 1.0; manufactured by Dow Corning Toray Co., Ltd.): 2.65 parts by weight (c) vinyltris(methylethylketoxyimino)silane: 2.64 parts by weight (d) a platinum catalyst SRX212 (manufactured by Dow Corning Toray Co., Ltd.; containing 6.0% by weight of the platinum catalyst): 6.17 parts by weight (the ink repelling liquid constituting 5.8 parts by weight)

(e) "ISOPAR" E (manufactured by Esso Chemical): 900 parts by weight

It is to be noted that the total of the components (a) to (d) of the solution 20 of the composition for the ink repellent layer is 100 parts by weight. With regard to the methyl hydrogen polysiloxane SH1107 (b), content of the siloxane structural unit represented by the general formula (I) in relation to total (100% by mole) of the siloxane structural unit represented by the general formula (I) and the siloxane structural unit represented by the general formula (II) is 100% by mole. Molar ratio of number of the SiH groups in the methyl hydrogen polysiloxane SH1107 (b) to number of the vinyl groups in the DMS-V52 (a) (number of the SiH groups/number of the vinyl groups) is 12.8.

The resulting precursor for lithographic printing was evaluated for its physical properties of the plate surface by the procedures as described above. The elastic modulus of the plate surface was 43.3 MPa, and the surface roughness Ra was 0.32 µm. When this precursor was developed by the procedure as described above, the reproduction rate of the 10 µm fine line was 100%, and the reproduction rate of the 6.4 µm fine line was 80% indicating the high picture reproduction performance. However, when the printing test by the procedure as described above was conducted by using the resulting lithographic printing plate, the scumming start temperature was 22.4° C., and the printable number of sheets before plate wear was 10,000, with both scumming resistance and printing durability being practically unacceptable.

The results of the Examples 1 to 17 and the Comparative Examples 1 to 3 are summarized in Table 1-1 and Table 1-2.

TABLE 1-1

| | Elastic modulus of the plate surface (MPa) | Surface roughness Ra (μm) | Composition of organic layer | | Composition of Ink repellent layer (silicone rubber layer) | | | |
|---|---|---|---|---|---|---|---|---|
| | | | Polyurethane resin content (% by weight) | Epoxy resin content (% by weight) | Type of curing | Content of [SiH(CH$_3$)—O—] unit in SiH compound (% by mole) | Weight average molecular weight of polysiloxane | Molar ratio of SiH group/vinyl group |
| Example 1 | 30.5 | 0.45 | 51.7 | 29.2 | Condensation type | — | 140,000 | — |
| Example 2 | 32.4 | 0.35 | 51.7 | 29.2 | Condensation type | — | 100,000 | — |
| Example 3 | 30.4 | 0.37 | 51.7 | 29.2 | Condensation type | — | 100,000 | — |
| Example 4 | 29.4 | 0.37 | 51.7 | 29.2 | Condensation type | — | 100,000 | — |
| Example 5 | 25.0 | 0.40 | 51.7 | 29.2 | Condensation type | — | 60,000 | — |
| Example 6 | 34.5 | 0.34 | 51.7 | 29.2 | Condensation type | — | 60,000 | — |
| Example 7 | 34.2 | 0.34 | 51.7 | 29.2 | Condensation type | — | 60,000 | — |
| Example 8 | 34.2 | 0.28 | 51.7 | 29.2 | Addition type | 100 | 49,500 | 8.0 |
| Example 9 | 26.1 | 0.34 | 51.7 | 29.2 | Addition type | 30 | 49,500 | 1.1 |
| Example 10 | 32.0 | 0.29 | 51.7 | 29.2 | Addition type | 50 | 49,500 | 7.0 |
| Example 11 | 26.1 | 0.34 | 51.7 | 29.2 | Addition type | 50 | 49,500 | 1.1 |
| Example 12 | 27.0 | 0.34 | 51.7 | 29.2 | Addition type | 50 | 49,500 | 2.0 |
| Example 13 | 28.5 | 0.32 | 51.7 | 29.2 | Addition type | 50 | 49,500 | 3.5 |
| Example 14 | 31.0 | 0.30 | 51.7 | 29.2 | Addition type | 50 | 49,500 | 6.0 |
| Example 15 | 33.2 | 0.29 | 51.7 | 29.2 | Addition type | 50 | 49,500 | 4.0 |
| Example 16 | 25.8 | 0.33 | 51.7 | 29.2 | Addition type | 50 | 49,500 | 4.8 |
| Example 17 | 28.4 | 0.35 | 51.7 | 29.2 | Addition type | 50 | 100,000 | 6.0 |
| Comparative Example 1 | 15.5 | 0.54 | 51.7 | 29.2 | Condensation type | — | 140,000 | — |
| Comparative Example 2 | 16.0 | 0.41 | 51.7 | 29.2 | Addition type | 100 | 49,500 | 1.0 |
| Comparative Example 3 | 43.3 | 0.32 | 51.7 | 29.2 | Addition type | 100 | 150,000 | 12.8 |

TABLE 1-2

| | Ink repellent liquid in ink repellent layer | | | | | | Performance of plate material | | | |
|---|---|---|---|---|---|---|---|---|---|---|
| | | | | Content (% by weight) | | | Image reproduction rate (%) | | Scumming | Printable number |
| | Type | Boiling point (° C.) | Surface tension (mN/m) | Amount added | Amount of catalyst incorporated | Total | Fine line of 10 μm | Fine line of 6.4 μm | start temperature (° C.) | of sheets before plate wear (sheets) |
| Example 1 | None | — | — | 0 | 0 | 0 | 100 | 60 | 24.0 | 50,000 |
| Example 2 | None | — | — | 0 | 0 | 0 | 100 | 95 | 24.0 | 70,000 |
| Example 3 | Solvesso 200 | >150 | 36 | 3 | 0 | 3 | 100 | 90 | 25.0 | 70,000 |
| Example 4 | Solvesso 100 | >150 | 29 | 3 | 0 | 3 | 100 | 90 | 26.0 | 70,000 |
| Example 5 | Solvesso 100 | >150 | 29 | 15 | 0 | 15 | 100 | 85 | 31.0 | 80,000 |
| Example 6 | Solvesso 100 | >150 | 29 | 5.8 | 0 | 5.8 | 100 | 100 | 26.5 | 80,000 |
| Example 7 | KF-96-50cs | >150 | 20.8 | 5.8 | 0 | 5.8 | 100 | 100 | 27.0 | 80,000 |
| Example 8 | None | — | — | 0 | 5.8 | 5.8 | 100 | 100 | 26.4 | 70,000 |
| Example 9 | KF-96-50cs | >150 | 20.8 | 4.2 | 5.8 | 10.0 | 100 | 100 | 30.0 | 70,000 |
| Example 10 | KF-96-50cs | >150 | 20.8 | 4.2 | 5.8 | 10.0 | 100 | 100 | 28.6 | 80,000 |
| Example 11 | KF-96-50cs | >150 | 20.8 | 4.2 | 5.8 | 10.0 | 100 | 100 | 30.0 | 70,000 |
| Example 12 | KF-96-50cs | >150 | 20.8 | 4.2 | 5.8 | 10.0 | 100 | 100 | 29.8 | 90,000 |
| Example 13 | KF-96-50cs | >150 | 20.8 | 4.2 | 5.8 | 10.0 | 100 | 100 | 29.5 | 100,000 |
| Example 14 | KF-96-50cs | >150 | 20.8 | 4.2 | 5.8 | 10.0 | 100 | 100 | 29.0 | 100,000 |
| Example 15 | None | — | — | 0 | 5.8 | 5.8 | 100 | 100 | 27.4 | 100,000 |
| Example 16 | KF-96-50cs | >150 | 20.8 | 8.2 | 5.8 | 14.0 | 100 | 100 | 31.2 | 90,000 |
| Example 17 | KF-96-50cs | >150 | 20.8 | 4.2 | 5.8 | 10.0 | 100 | 95 | 29.0 | 70,000 |
| Comparative Example 1 | KF-96-50cs | >150 | 20.8 | 15 | 0.0 | 15.0 | 40 | 0 | 30.0 | 5,000 |
| Comparative Example 2 | KF-96-50cs | >150 | 20.8 | 14.2 | 5.8 | 20.0 | 50 | 10 | 33.0 | 5,000 |
| Comparative Example 3 | None | — | — | 0 | 5.8 | 5.8 | 100 | 80 | 22.4 | 10,000 |

Example 18

The procedure of Example 1 was repeated except that the solution of the composition for the heat sensitive layer was directly coated on the aluminum base without coating the solution of the composition for the organic layer to obtain a precursor for lithographic printing.

The resulting precursor for lithographic printing was evaluated for its physical properties of the plate surface by the procedures as described above. The elastic modulus of the plate surface was 35.0 MPa, and the surface roughness Ra was 0.51 µm. When this precursor was developed by the procedure as described above, the reproduction rate of the 10 µm fine line was 100%, and the reproduction rate of the 6.4 µm fine line was 25% indicating the high picture reproduction performance. When the printing test by the procedure as described above was conducted by using the resulting lithographic printing plate, the scumming start temperature was 24.0° C., and the printable number of sheets before plate wear was 20,000.

Example 19

The procedure of Example 1 was repeated except that the solution of the composition for the organic layer was replaced with the solution 1 of the composition for the organic layer as described below to obtain a precursor for lithographic printing.

<Solution 1 of the Composition for the Organic Layer>

(a) a polymer having an active hydrogen: epoxy resin: "Epikote" (Registered Trademark) 1010 (manufactured by Japan Epoxy Resin): 24.5 parts by weight (b) a polymer having an active hydrogen: polyurethane: "SANPRENE" (Registered Trademark) LQ-T1331D (manufactured by Sanyo Chemical Industries, Ltd.; solid content concentration, 20% by weight): 49.0 parts by weight (c) an aluminum chelate: aluminum chelate ALCH-TR (manufactured by Kawaken Fine Chemicals Co., Ltd.): 5.4 parts by weight (d) a levelling agent: "DISPARLON" (Registered Trademark) LC951 (manufactured by Kusumoto Chemicals Ltd.; solid content, 10% by weight): 0.1 parts by weight (e) titanium oxide: a dispersion of "TIPAQUE" (Registered Trademark) CR-50 (manufactured by Ishihara Sangyo Kaisha, Ltd.) in N,N-dimethylformamide (titanium oxide, 50% by weight): 21.0 parts by weight (f) N,N-dimethylformamide: 450 parts by weight (g) methyl ethyl ketone: 150 parts by weight The amount of each component blended in the solution 1 of the composition for the organic layer is shown in parts by weight in relation to 100 parts by weight of the total of the components (a) to (e) blended.

The resulting precursor for lithographic printing was evaluated for its physical properties of the plate surface by the procedures as described above. The elastic modulus of the plate surface was 30.8 MPa, and the surface roughness Ra was 0.45 µm. When this precursor was developed by the procedure as described above, the reproduction rate of the 10 µm fine line was 100%, and the reproduction rate of the 6.4 µm fine line was 55% indicating the high picture reproduction performance. When the printing test by the procedure as described above was conducted by using the resulting lithographic printing plate, the scumming start temperature was 24.0° C., and the printable number of sheets before plate wear was 40,000.

Example 20

The procedure of Example 1 was repeated except that the solution of the composition for the organic layer was replaced with the solution 2 of the composition for the organic layer as described below to obtain a precursor for lithographic printing.

<Solution 2 of the Composition for the Organic Layer>

(a) a polymer having an active hydrogen: epoxy resin: "Epikote" (Registered Trademark) 1010 (manufactured by Japan Epoxy Resin): 5.7 parts by weight (b) a polymer having an active hydrogen: polyurethane: "SANPRENE" (Registered Trademark) LQ-T1331D (manufactured by Sanyo Chemical Industries, Ltd.; solid content concentration, 20% by weight): 65.7 parts by weight (c) an aluminum chelate: aluminum chelate ALCH-TR (manufactured by Kawaken Fine Chemicals Co., Ltd.): 4.5 parts by weight (d) a levelling agent: "DISPARLON" (Registered Trademark) LC951 (manufactured by Kusumoto Chemicals Ltd.; solid content, 10% by weight): 0.1 parts by weight (e) titanium oxide: a dispersion of "TIPAQUE" (Registered Trademark) CR-50 (manufactured by Ishihara SangyoKaisha, Ltd.) in N,N-dimethylformamide (titanium oxide, 50% by weight): 24.0 parts by weight (f) N,N-dimethylformamide: 450 parts by weight (g) methyl ethyl ketone: 150 parts by weight The amount of each component blended in the solution 2 of the composition for the organic layer is shown in parts by weight in relation to 100 parts by weight of the total of the components (a) to (e) blended.

The resulting precursor for lithographic printing was evaluated for its physical properties of the plate surface by the procedures as described above. The elastic modulus of the plate surface was 30.0 MPa, and the surface roughness Ra was 0.45 µm. When this precursor was developed by the procedure as described above, the reproduction rate of the 10 µm fine line was 100%, and the reproduction rate of the 6.4 µm fine line was 55% indicating the high picture reproduction performance. When the printing test by the procedure as described above was conducted by using the resulting lithographic printing plate, the scumming start temperature was 24.5° C., and the printable number of sheets before plate wear was 35,000.

Example 21

The procedure of Example 1 was repeated except that the solution of the composition for the organic layer was replaced with the solution 3 of the composition for the organic layer as described below to obtain a precursor for lithographic printing.

<Solution 3 of the Composition for the Organic Layer>

(a) a polymer having an active hydrogen: epoxy resin: "Epikote" (Registered Trademark) 1010 (manufactured by Japan Epoxy Resin): 30.4 parts by weight (b) a polymer having an active hydrogen: polyurethane: "SANPRENE" (Registered Trademark) LQ-T1331D (manufactured by Sanyo Chemical Industries, Ltd.; solid content concentration, 20% by weight): 57.3 parts by weight (c) an aluminum chelate: aluminum chelate ALCH-TR (manufactured by Kawaken Fine Chemicals Co., Ltd.): 6.2 parts by weight (d) a levelling agent: "DISPARLON" (Registered Trademark) LC951 (manufactured by Kusumoto Chemicals Ltd.; solid content, 10% by weight): 0.1 parts by weight (e) titanium oxide: a dispersion of "TIPAQUE" (Registered Trademark) CR-50 (manufactured by Ishihara Sangyo Kaisha, Ltd.) in N,N-dimethylformamide (titanium oxide, 50% by weight): 6.0 parts by weight (f) N,N-dimethylformamide: 450 parts by weight (g) methyl ethyl ketone: 150 parts by weight The amount of each component blended in the solution 3 of the composition for the organic layer is shown in parts by weight in relation to 100 parts by weight of the total of the components (a) to (e) blended.

The resulting precursor for lithographic printing was evaluated for its physical properties of the plate surface by the procedures as described above. The elastic modulus of the plate surface was 30.2 MPa, and the surface roughness Ra was 0.45 µm. When this precursor was developed by the procedure as described above, the reproduction rate of the 10 µm fine line was 100%, and the reproduction rate of the 6.4 µm fine line was 55% indicating the high picture reproduction performance. When the printing test by the procedure as described above was conducted by using the resulting lithographic printing plate, the scumming start temperature was 24.3° C., and the printable number of sheets before plate wear was 60,000.

Example 22

The procedure of Example 2 was repeated except that the solution of the composition for the organic layer was replaced with the solution 3 of the composition for the organic layer as described below to obtain a precursor for lithographic printing.

The resulting precursor for lithographic printing was evaluated for its physical properties of the plate surface by the procedures as described above. The elastic modulus of the plate surface was 32.2 MPa, and the surface roughness Ra was 0.35 µm. When this precursor was developed by the procedure as described above, the reproduction rate of the 10 µm fine line was 100%, and the reproduction rate of the 6.4 µm fine line was 95% indicating the high picture reproduction performance. When the printing test by the procedure as described above was conducted by using the resulting lithographic printing plate, the scumming start temperature was 24.3° C., and the printable number of sheets before plate wear was 75,000.

Example 23

The procedure of Example 21 was repeated except that the solution 1 of the composition for the ink repellent layer was replaced with the solution 21 of the composition for the ink repellent layer as described below to obtain a precursor for lithographic printing.
<Solution 21 of the Composition for the Ink Repellent Layer>
  (a) α,ω-divinyl polydimethylsiloxane: DMS-V22 (weight average molecular weight, 9,400; manufactured by GELEST Inc.): 46.19 parts by weight
  (b) a silicone oil: KF-96-50cs (weight average molecular weight, 3,780; surface tension, 20.8 mN/m; boiling point, > 150° C.; manufactured by Shin-Etsu Chemical Co., Ltd.): 20.0 parts by weight
  (c) a methyl hydrogen siloxane-dimethylsiloxane copolymer HMS-301 ((I)/(I)+(II)=0.275; manufactured by GELEST Inc.): 25.0 parts by weight
  (d) vinyltris(methyethylketoxyimino)silane: 2.64 parts by weight
  (e) a platinum catalyst SRX212 (manufactured by Dow Corning Toray Co., Ltd.; containing 6.0% by weight of the platinum catalyst): 6.17 parts by weight (the ink repelling liquid constituting 5.8 parts by weight)
  (f) "ISOPAR" E (manufactured by Esso Chemical): 900 parts by weight It is to be noted that the total of the components (a) to (e) of the solution 21 of the composition for the ink repellent layer is 100 parts by weight. With regard to the methyl hydrogen siloxane-dimethylsiloxane copolymer HMS-301 (c), content of the siloxane structural unit represented by the general formula (I) in relation to total (100% by mole) of the siloxane structural unit represented by the general formula (I) and the siloxane structural unit represented by the general formula (II) is 27.5% by mole. Molar ratio of number of the SiH groups in the HMS-301 (c) to number of the vinyl groups in the DMS-V22 (a) (number of the SiH groups/number of the vinyl groups) is 7.1.

The resulting precursor for lithographic printing was evaluated for its physical properties of the plate surface by the procedures as described above. The elastic modulus of the plate surface was 34.8 MPa, and the surface roughness Ra was 0.32 µm. When the crosslink density was measured by the procedure as described above, the [—CH$_2$—Si*(CH$_3$)$_2$—O—Si]/[Si—O—Si*(CH$_3$)$_2$—O—Si] molar ratio was 0.01058. When this precursor was developed by the procedure as described above, the reproduction rate of the 10 µm fine line was 100%, and the reproduction rate of the 6.4 µm fine line was 100%, indicating the very high picture reproduction performance. When the printing test by the procedure as described above was conducted by using the resulting lithographic printing plate, the results were favorable with the scumming start temperature of 33.8° C. and the printable number of sheets before plate wear of 50,000.

Example 24

The procedure of Example 21 was repeated except that the solution 1 of the composition for the ink repellent layer was replaced with the solution 22 of the composition for the ink repellent layer as described below to obtain a precursor for lithographic printing.
<Solution 22 of the Composition for the Ink Repellent Layer>
  (a) α,ω-divinyl polydimethylsiloxane: DMS-V46(weight average molecular weight, 117,000; manufactured by GELEST Inc.): 86.95 parts by weight
  (b) a methyl hydrogen siloxane-dimethylsiloxane copolymer HMS-301 ((I)/(I)+(II)=0.275; manufactured by GELEST Inc.): 4.24 parts by weight
  (c) vinyltris(methyethylketoxyimino)silane: 2.64 parts by weight
  (d) a platinum catalyst SRX212 (manufactured by Dow Corning Toray Co., Ltd.; containing 6.0% by weight of the platinum catalyst): 6.17 parts by weight (the ink repelling liquid constituting 5.8 parts by weight)
  (e) "ISOPAR" E (manufactured by Esso Chemical): 900 parts by weight It is to be noted that the total of the components (a) to (d) of the solution 22 of the composition for the ink repellent layer is 100 parts by weight. With regard to the methyl hydrogen siloxane-dimethylsiloxane copolymer HMS-301 (b), content of the siloxane structural unit represented by the general formula (I) in relation to total (100% by mole) of the siloxane structural unit represented by the general formula (I) and the siloxane structural unit represented by the general formula (II) is 27.5% by mole. Molar ratio of number of the SiH groups in the HMS-301 (b) to number of the vinyl groups in the DMS-V46 (a) (number of the SiH groups/number of the vinyl groups) is 4.4.

The resulting precursor for lithographic printing was evaluated for its physical properties of the plate surface by the procedures as described above. The elastic modulus of the plate surface was 25.7 MPa, and the surface roughness Ra was 0.34 µm. When the crosslink density was measured by the procedure as described above, the [—CH$_2$—Si*(CH$_3$)$_2$—O—Si]/[Si—O—Si*(CH$_3$)$_2$—O—Si] molar ratio was 0.00106. When this precursor was developed by the procedure as described above, the reproduction rate of the 10 µm fine line was 100%, and the reproduction rate of the 6.4

µm fine line was 75% indicating the high picture reproduction performance. When the printing test by the procedure as described above was conducted by using the resulting lithographic printing plate, the results were favorable with the scumming start temperature of 27.5° C. and the printable number of sheets before plate wear of 50,000.

Example 25

The procedure of Example 21 was repeated except that the solution 1 of the composition for the ink repellent layer was replaced with the solution 23 of the composition for the ink repellent layer as described below to obtain a precursor for lithographic printing.
<Solution 23 of the Composition for the Ink Repellent Layer>
(a) α,ω-divinyl polydimethylsiloxane: DMS-V35 (weight average molecular weight, 49,500; manufactured by GELEST Inc.): 79.95 parts by weight
(b) a silicone oil: KF-96-50cs (weight average molecular weight, 3,780; surface tension, 20.8 mN/m; boiling point, > 150° C.; manufactured by Shin-Etsu Chemical Co., Ltd.): 4.2 parts by weight
(c) a methyl hydrogen siloxane-dimethylsiloxane copolymer HMS-301 ((I)/(I)+(II)=0.275; manufactured by GELEST Inc.): 7.04 parts by weight
(d) vinyltris(methyethylketoxyimino)silane: 2.64 parts by weight
(e) a platinum catalyst SRX212 (manufactured by Dow Corning Toray Co., Ltd.; containing 6.0% by weight of the platinum catalyst): 6.17 parts by weight (the ink repelling liquid constituting 5.8 parts by weight)
(f) "ISOPAR" E (manufactured by Esso Chemical): 900 parts by weight It is to be noted that the total of the components (a) to (e) of the solution 23 of the composition for the ink repellent layer is 100 parts by weight. With regard to the methyl hydrogen siloxane-dimethylsiloxane copolymer HMS-301 (c), content of the siloxane structural unit represented by the general formula (I) in relation to total (100% by mole) of the siloxane structural unit represented by the general formula (I) and the siloxane structural unit represented by the general formula (II) is 27.5% by mole. Molar ratio of number of the SiH groups in the HMS-301 (c) to number of the vinyl groups in the DMS-V35 (a) (number of the SiH groups/number of the vinyl groups) is 3.8.

The resulting precursor for lithographic printing was evaluated for its physical properties of the plate surface by the procedures as described above. The elastic modulus of the plate surface was 26.5 MPa, and the surface roughness Ra was 0.32 µm. When the crosslink density was measured by the procedure as described above, the [—CH$_2$—Si*(CH$_3$)$_2$—O—Si]/[Si—O—Si*(CH$_3$)$_2$—O—Si] molar ratio was 0.00237. When this precursor was developed by the procedure as described above, the reproduction rate of the 10 µm fine line was 100%, and the reproduction rate of the 6.4 µm fine line was 80% indicating the high picture reproduction performance. When the printing test by the procedure as described above was conducted by using the resulting lithographic printing plate, the results were favorable with the scumming start temperature of 29.6° C. and the printable number of sheets before plate wear of 80,000.

Example 26

The procedure of Example 21 was repeated except that the solution 1 of the composition for the ink repellent layer was replaced with the solution 24 of the composition for the ink repellent layer as described below to obtain a precursor for lithographic printing.
<Solution 24 of the Composition for the Ink Repellent Layer>
(a) α,ω-divinyl polydimethylsiloxane: DMS-V22 (weight average molecular weight, 9,400; manufactured by GELEST Inc.): 51.16 parts by weight
(b) a silicone oil: KF-96-50cs (weight average molecular weight, 3,780; surface tension, 20.8 mN/m; boiling point, > 150° C.; manufactured by Shin-Etsu Chemical Co., Ltd.): 34.2 parts by weight
(c) a methyl hydrogen polysiloxane SH1107 ((I)/(I)+(II)= 1.0; manufactured by Dow Corning Toray Co., Ltd.): 5.83 parts by weight
(d) vinyltris(methyethylketoxyimino)silane: 2.64 parts by weight
(e) a platinum catalyst SRX212 (manufactured by Dow Corning Toray Co., Ltd.; containing 6.0% by weight of the platinum catalyst): 6.17 parts by weight (the ink repelling liquid constituting 5.8 parts by weight)
(f) "ISOPAR" E (manufactured by Esso Chemical): 900 parts by weight It is to be noted that the total of the components (a) to (e) of the solution 24 of the composition for the ink repellent layer is 100 parts by weight. With regard to the methyl hydrogen polysiloxane SH1107 (c), content of the siloxane structural unit represented by the general formula (I) in relation to total (100% by mole) of the siloxane structural unit represented by the general formula (I) and the siloxane structural unit represented by the general formula (II) is 100% by mole. Molar ratio of number of the SiH groups in the SH1107 (c) to number of the vinyl groups in the DMS-V22 (a) (number of the SiH groups/number of the vinyl groups) is 5.4.

The resulting precursor for lithographic printing was evaluated for its physical properties of the plate surface by the procedures as described above. The elastic modulus of the plate surface was 25.2 MPa, and the surface roughness Ra was 0.37 µm. When the crosslink density was measured by the procedure as described above, the [—CH$_2$—Si*(CH$_3$)$_2$—O—Si]/[Si—O—Si*(CH$_3$)$_2$—O—Si] molar ratio was 0.00715. When this precursor was developed by the procedure as described above, the reproduction rate of the 10 µm fine line was 100%, and the reproduction rate of the 6.4 µm fine line was 90% indicating the high picture reproduction performance. When the printing test by the procedure as described above was conducted by using the resulting lithographic printing plate, the results were favorable with the scumming start temperature of 36.3° C. and the printable number of sheets before plate wear of 70,000.

Example 27

The procedure of Example 21 was repeated except that the solution 1 of the composition for the ink repellent layer was replaced with the solution 25 of the composition for the ink repellent layer as described below to obtain a precursor for lithographic printing.
<Solution 25 of the Composition for the Ink Repellent Layer>
(a) α,ω-divinyl polydimethylsiloxane: DMS-V35 (weight average molecular weight, 49,500; manufactured by GELEST Inc.): 85.25 parts by weight
(b) a methyl hydrogen siloxane-dimethylsiloxane copolymer RD-1 ((I)/(I)+(II)=0.5; manufactured by Dow Corning Toray Co., Ltd.): 5.94 parts by weight (c) vinyltris(methyethylketoxyimino)silane: 2.64 parts by weight (d) a platinum catalyst SRX212 (manufactured by Dow Corning Toray Co., Ltd.; containing 6.0% by weight of the platinum catalyst): 6.17 parts by weight (the ink repelling liquid constituting 5.8 parts by weight)

(e) "ISOPAR" E (manufactured by Esso Chemical): 900 parts by weight

It is to be noted that the total of the components (a) to (d) of the solution 25 of the composition for the ink repellent layer is 100 parts by weight. With regard to the methyl hydrogen siloxane-dimethylsiloxane copolymer RD-1 (b), content of the siloxane structural unit represented by the general formula (I) in relation to total (100% by mole) of the siloxane structural unit represented by the general formula (I) and the siloxane structural unit represented by the general formula (II) is 50% by mole. Molar ratio of number of the SiH groups in the RD-1 (b) to the number of vinyl groups in the DMS-V35 (a) (number of the SiH groups/number of the vinyl groups) is 4.9.

The resulting precursor for lithographic printing was evaluated for its physical properties of the plate surface by the procedures as described above. The elastic modulus of the plate surface was 33.8 MPa, and the surface roughness Ra was 0.28 μm. When the crosslink density was measured by the procedure as described above, the [—$CH_2$—$Si^*$($CH_3$)$_2$—O—Si]/[Si—O—$Si^*$($CH_3$)$_2$—O—Si] molar ratio was 0.00247. When this precursor was developed by the procedure as described above, the reproduction rate of the 10 μm fine line was 100%, and the reproduction rate of the 6.4 μm fine line was 100%, indicating the very high picture reproduction performance. When the printing test by the procedure as described above was conducted by using the resulting lithographic printing plate, the results were favorable with the scumming start temperature of 27.4° C. and the printable number of sheets before plate wear of 100,000.

Example 28

The procedure of Example 21 was repeated except that the solution 1 of the composition for the ink repellent layer was replaced with the solution 26 of the composition for the ink repellent layer as described below to obtain a precursor for lithographic printing.

<Solution 26 of the Composition for the Ink Repellent Layer>

(a) α,ω-divinyl polydimethylsiloxane: DMS-V35 (weight average molecular weight, 49,500; manufactured by GELEST Inc.): 86.95 parts by weight (b) a methyl hydrogen siloxane-dimethylsiloxane copolymer RD-1 ((I)/(I)+(II)=0.5; manufactured by Dow Corning Toray Co., Ltd.): 4.24 parts by weight (c) vinyltris(methyethylketoxyimino)silane: 2.64 parts by weight (d) a platinum catalyst SRX212 (manufactured by Dow Corning Toray Co., Ltd.; containing 6.0% by weight of the platinum catalyst): 6.17 parts by weight (the ink repelling liquid constituting 5.8 parts by weight)

(e) "ISOPAR" E (manufactured by Esso Chemical): 900 parts by weight

It is to be noted that the total of the components (a) to (d) of the solution 26 of the composition for the ink repellent layer is 100 parts by weight. With regard to methyl hydrogen siloxane-dimethylsiloxane copolymer RD-1 (b), content of the siloxane structural unit represented by the general formula (I) in relation to total (100% by mole) of the siloxane structural unit represented by the general formula (I) and the siloxane structural unit represented by the general formula (II) is 50% by mole. Molar ratio of number of the SiH groups in the RD-1 (b) to the number of vinyl groups in the DMS-V35 (a) (number of the SiH groups/number of the vinyl groups) is 3.4.

The resulting precursor for lithographic printing was evaluated for its physical properties of the plate surface by the procedures as described above. The elastic modulus of the plate surface was 32.3 MPa, and the surface roughness Ra was 0.30 μm. When the crosslink density was measured by the procedure as described above, the [—$CH_2$—$Si^*$($CH_3$)$_2$—O—Si]/[Si—O—$Si^*$($CH_3$)$_2$—O—Si] molar ratio was 0.00250. When this precursor was developed by the procedure as described above, the reproduction rate of the 10 μm fine line was 100%, and the reproduction rate of the 6.4 μm fine line was 100%, indicating the very high picture reproduction performance. When the printing test by the procedure as described above was conducted by using the resulting lithographic printing plate, the results were favorable with the scumming start temperature of 27.7° C. and the printable number of sheets before plate wear of 100,000.

Example 29

The procedure of Example 21 was repeated except that the solution 1 of the composition for the ink repellent layer was replaced with the solution 27 of the composition for the ink repellent layer as described below to obtain a precursor for lithographic printing.

<Solution 27 of the Composition for the Ink Repellent Layer>

(a) α,ω-divinyl polydimethylsiloxane: DMS-V31 (weight average molecular weight, 28,000; manufactured by GELEST Inc.): 86.95 parts by weight (b) a methyl hydrogen siloxane-dimethylsiloxane copolymer RD-1 ((I)/(I)+(II)=0.5; manufactured by Dow Corning Toray Co., Ltd.): 4.24 parts by weight (c) vinyltris(methyethylketoxyimino)silane: 2.64 parts by weight (d) a platinum catalyst SRX212 (manufactured by Dow Corning Toray Co., Ltd.; containing 6.0% by weight of the platinum catalyst): 6.17 parts by weight (the ink repelling liquid constituting 5.8 parts by weight)

(e) "ISOPAR" E (manufactured by Esso Chemical): 900 parts by weight

It is to be noted that the total of the components (a) to (d) of the solution 27 of the composition for the ink repellent layer is 100 parts by weight. With regard to the methyl hydrogen siloxane-dimethylsiloxane copolymer RD-1 (b), content of the siloxane structural unit represented by the general formula (I) in relation to total (100% by mole) of the siloxane structural unit represented by the general formula (I) and the siloxane structural unit represented by the general formula (II) is 50% by mole. Molar ratio of number of the SiH groups in the RD-1 (b) to number of the vinyl groups in the DMS-V31 (a) (number of the SiH groups/number of the vinyl groups) is 2.1.

The resulting precursor for lithographic printing was evaluated for its physical properties of the plate surface by the procedures as described above. The elastic modulus of the plate surface was 35.0 MPa, and the surface roughness Ra was 0.29 μm. When the crosslink density was measured by the procedure as described above, the [—$CH_2$—$Si^*$($CH_3$)$_2$—O—Si]/[Si—O—$Si^*$($CH_3$)$_2$—O—Si] molar ratio was 0.00472. When this precursor was developed by the procedure as described above, the reproduction rate of the 10 μm fine line was 100%, and the reproduction rate of the 6.4

μm fine line was 100%, indicating the very high picture reproduction performance. When the printing test by the procedure as described above was conducted by using the resulting lithographic printing plate, the results were favorable with the scumming start temperature of 28.0° C. and the printable number of sheets before plate wear of 70,000.

Example 30

The procedure of Example 21 was repeated except that the solution 1 of the composition for the ink repellent layer was replaced with the solution 28 of the composition for the ink repellent layer as described below to obtain a precursor for lithographic printing.
<Solution 28 of the Composition for the Ink Repellent Layer>
(a) α,ω-divinyl polydimethylsiloxane: DMS-V22 (weight average molecular weight, 17,200; manufactured by GELEST Inc.): 60.00 parts by weight
(b) a silicone oil: KF-96-50cs (weight average molecular weight, 3,780; surface tension, 20.8 mN/m; boiling point, > 150° C.; manufactured by Shin-Etsu Chemical Co., Ltd.): 24.20 parts by weight
(c) a methyl hydrogen siloxane-dimethylsiloxane copolymer RD-1 ((I)/(I)+(II)=0.5; manufactured by Dow Corning Toray Co., Ltd.): 6.99 parts by weight
(d) vinyltris(methyethylketoxyimino)silane: 2.64 parts by weight
(e) a platinum catalyst SRX212 (manufactured by Dow Corning Toray Co., Ltd.; containing 6.0% by weight of the platinum catalyst): 6.17 parts by weight (the ink repelling liquid constituting 5.8 parts by weight)
(f) "ISOPAR" E (manufactured by Esso Chemical): 900 parts by weight It is to be noted that the total of the components (a) to (e) of the solution 28 of the composition for the ink repellent layer is 100 parts by weight. With regard to the methyl hydrogen siloxane-dimethylsiloxane copolymer RD-1 (c), content of the siloxane structural unit represented by the general formula (I) in relation to total (100% by mole) of the siloxane structural unit represented by the general formula (I) and the siloxane structural unit represented by the general formula (II) is 50% by mole. Molar ratio of number of the SiH groups in the RD-1 (c) to number of the vinyl groups in the DMS-V22 (a) (number of the SiH groups/number of the vinyl groups) is 2.5.

The resulting precursor for lithographic printing was evaluated for its physical properties of the plate surface by the procedures as described above. The elastic modulus of the plate surface was 25.2 MPa, and the surface roughness Ra was 0.39 μm. When the crosslink density was measured by the procedure as described above, the [—$CH_2$—$Si^*$($CH_3$)$_2$—O—Si]/[Si—O—$Si^*$($CH_3$)$_2$—O—Si] molar ratio was 0.00875. When this precursor was developed by the procedure as described above, the reproduction rate of the 10 μm fine line was 100%, and the reproduction rate of the 6.4 μm fine line was 85% indicating the high picture reproduction performance. When the printing test by the procedure as described above was conducted by using the resulting lithographic printing plate, the results were favorable with the scumming start temperature of 35.9° C. and the printable number of sheets before plate wear of 70,000.

Comparative Example 4

The procedure of Example 2 was repeated except that the solution of the composition for the heat sensitive layer was directly coated on the aluminum base without coating the solution of the composition for the organic layer to obtain a precursor for lithographic printing.

The resulting precursor for lithographic printing was evaluated for its physical properties of the plate surface by the procedures as described above. The elastic modulus of the plate surface was 36.9 MPa, and the surface roughness Ra was 0.41 μm. When this precursor was developed by the procedure as described above, the reproduction rate of the 10 μm fine line was 100%, and the reproduction rate of the 6.4 μm fine line was 65% indicating the high picture reproduction performance. However, when the printing test by the procedure as described above was conducted by using the resulting lithographic printing plate, the scumming start temperature was 23.0° C., and the printable number of sheets before plate wear was 10,000, with both scumming resistance and printing durability being practically unacceptable.

The results of the Examples 18 to 30 and the Comparative Example 4 are summarized in Table 2-1 and Table 2-2.

TABLE 2-1

| | | | Composition of Ink repellent layer (silicone rubber layer) | | | | | |
|---|---|---|---|---|---|---|---|---|
| | Elastic modulus of the plate surface (MPa) | Surface roughness Ra (μm) | Composition of organic layer | | Type of curing | Content of [SiH(CH3)—O—] unit in SiH compound (% by mole) | Weight average molecular weight of polysiloxane | Molar ratio of SiH group/ vinyl group | Molar ratio of [—$CH_2$—$Si^*$($CH_3$)$_2$—O—Si]/ [Si—O—$Si^*$($CH_3$)$_2$—O—Si] |
| | | | Polyurethane resin content (% by weight) | Epoxy resin content (% by weight) | | | | | |
| Example 18 | 35.0 | 0.51 | — | — | Condensation type | — | 140,000 | — | — |
| Example 19 | 30.8 | 0.45 | 49.0 | 24.5 | Condensation type | — | 140,000 | — | — |
| Example 20 | 30.0 | 0.45 | 65.7 | 5.7 | Condensation type | — | 140,000 | — | — |
| Example 21 | 30.2 | 0.45 | 57.3 | 30.4 | Condensation type | — | 140,000 | — | — |
| Example 22 | 32.2 | 0.35 | 57.3 | 30.4 | Condensation type | — | 100,000 | — | — |
| Example 23 | 34.8 | 0.32 | 57.3 | 30.4 | Addition type | 27.5 | 9,400 | 7.1 | 0.01058 |
| Example 24 | 25.7 | 0.34 | 57.3 | 30.4 | Addition type | 27.5 | 117,000 | 4.4 | 0.00106 |

TABLE 2-1-continued

| | | | Composition of organic layer | | | Composition of Ink repellent layer (silicone rubber layer) | | | |
|---|---|---|---|---|---|---|---|---|---|
| | Elastic modulus of the plate surface (MPa) | Surface roughness Ra (μm) | Polyurethane resin content (% by weight) | Epoxy resin content (% by weight) | Type of curing | Content of [SiH(CH3)—O—] unit in SiH compound (% by mole) | Weight average molecular weight of polysiloxane | Molar ratio of SiH group/ vinyl group | Molar ratio of [—CH$_2$—Si*(CH$_3$)$_2$—O—Si]/ [Si—O—Si*(CH$_3$)$_2$—O—Si] |
| Example 25 | 26.5 | 0.32 | 57.3 | 30.4 | Addition type | 27.5 | 49,500 | 3.8 | 0.00237 |
| Example 26 | 25.2 | 0.37 | 57.3 | 30.4 | Addition type | 100.0 | 9,400 | 5.4 | 0.00715 |
| Example 27 | 33.8 | 0.28 | 57.3 | 30.4 | Addition type | 50.0 | 49,500 | 4.9 | 0.00247 |
| Example 28 | 32.3 | 0.30 | 57.3 | 30.4 | Addition type | 50.0 | 49,500 | 3.4 | 0.00250 |
| Example 29 | 35.0 | 0.29 | 57.3 | 30.4 | Addition type | 50.0 | 28,000 | 2.1 | 0.00472 |
| Example 30 | 25.2 | 0.39 | 57.3 | 30.4 | Addition type | 50.0 | 17,200 | 2.5 | 0.00875 |
| Comparative Example 4 | 36.9 | 0.41 | — | — | Condensation type | — | 100,000 | — | — |

TABLE 2-2

| | Ink repellent liquid in ink repellent layer | | | | | Performance of plate material | | | |
|---|---|---|---|---|---|---|---|---|---|
| | | | | Content (% by weight) | | Image reproduction rate (%) | | Scumming | Printable number of sheets |
| | Type | Boiling point (° C.) | Surface tension (mN/m) | Amount added | Amount of catalyst incorporated | Total | Fine line of 10 μm | Fine line of 6.4 μm | start temperature (° C.) | before plate wear (sheets) |
| Example 18 | None | — | — | 0 | 0.0 | 0.0 | 100 | 25 | 24.0 | 20,000 |
| Example 19 | None | — | — | 0 | 0.0 | 0.0 | 100 | 55 | 24.0 | 40,000 |
| Example 20 | None | — | — | 0 | 0.0 | 0.0 | 100 | 55 | 24.5 | 35,000 |
| Example 21 | None | — | — | 0 | 0.0 | 0.0 | 100 | 55 | 24.3 | 60,000 |
| Example 22 | None | — | — | 0 | 0.0 | 0.0 | 100 | 95 | 24.3 | 75,000 |
| Example 23 | KF-96-50cs | >150 | 20.8 | 20 | 5.8 | 25.8 | 100 | 100 | 33.8 | 50,000 |
| Example 24 | None | — | — | 0 | 5.8 | 5.8 | 100 | 75 | 27.5 | 50,000 |
| Example 25 | KF-96-50cs | >150 | 20.8 | 4.2 | 5.8 | 10.0 | 100 | 80 | 29.6 | 80,000 |
| Example 26 | KF-96-50cs | >150 | 20.8 | 34.2 | 5.8 | 40.0 | 100 | 90 | 36.3 | 70,000 |
| Example 27 | None | — | — | 0 | 5.8 | 5.8 | 100 | 100 | 27.4 | 100,000 |
| Example 28 | None | — | — | 0 | 5.8 | 5.8 | 100 | 100 | 27.7 | 100,000 |
| Example 29 | None | — | — | 0 | 5.8 | 5.8 | 100 | 100 | 28.0 | 70,000 |
| Example 30 | KF-96-50cs | >150 | 20.8 | 24.2 | 5.8 | 30.0 | 100 | 85 | 35.9 | 70,000 |
| Comparative Example 4 | None | — | — | 0 | 0.0 | 0.0 | 100 | 65 | 23.0 | 10,000 |

The invention claimed is:

1. A precursor for lithographic printing comprising at least a heat sensitive layer and an ink repellent layer wherein the ink repellent layer has an elastic modulus of the plate surface under the surface load of 14000 N/m$^2$ of at least 25 MPa and up to 35 MPa.

2. A precursor for lithographic printing according to claim 1 further comprising an organic layer provided on the heat sensitive layer on the side opposite to the ink repellent layer.

3. A precursor for lithographic printing according to claim 2 wherein the organic layer contains at least 51% by weight and up to 65% by weight of a polyurethane resin and at least 27% by weight and up to 35% by weight of an epoxy resin.

4. A precursor for lithographic printing according to claim 1 wherein the ink repellent layer has a surface roughness Ra of up to 0.40 μm.

5. A precursor for lithographic printing according to claim 1 wherein the ink repellent layer is a layer comprising a silicone rubber.

6. A precursor for lithographic printing according to claim 5 wherein the silicone rubber has a structure derived from (a) a SiH group-containing compound and (b) a vinyl group-containing polysiloxane.

7. A precursor for lithographic printing according to claim 6 wherein, in solid $^{29}$Si NMR spectrum of the silicone rubber, the peak corresponding to the dimethylsiloxane unit represented by the following general formula (i) and the peak corresponding to the siloxane unit represented by the following general formula (ii) are observed, and ratio of the peak areas (ii)/(i) is 0.00240 to 0.00900:

Si—O—Si*(CH$_3$)$_2$—O—Si     (i)

—CH$_2$—Si*(CH$_3$)$_2$—O—Si     (ii)

8. A precursor for lithographic printing according to claim 1 wherein the ink repellent layer contains an ink repellent liquid, and the ink repellent liquid has a boiling point at 1 atmosphere of at least 150° C.

9. A precursor for lithographic printing according to claim 8 wherein the ink repellent liquid has a surface tension at 25° C. of at least 15 mN/m and up to 30 mN/m.

10. A precursor for lithographic printing according to claim 8 wherein the ink repellent layer contains at least 4% by weight and up to 40% by weight of the ink repellent liquid.

11. A precursor for lithographic printing according to claim 8 wherein the ink repellent layer contains at least 4.5% by weight and up to 14% by weight of the ink repellent liquid.

12. A precursor for lithographic printing according to claim 8 wherein the ink repellent liquid is a silicone oil.

13. A precursor for lithographic printing according to claim 6 wherein the SiH group-containing compound (a) is a copolymer of siloxane structural unit represented by the following general formula (I) and siloxane structural unit represented by the formula (II):

—[SiH(CH$_3$)—O—]—             (I)

—[Si(CH$_3$)$_2$—O—]—            (II).

14. A precursor for lithographic printing according to claim 13 wherein content of the siloxane structural unit represented by the general formula (I) in relation to total (100% by mole) of the siloxane structural unit represented by the general formula (I) and the siloxane structural unit represented by the general formula (II) in the SiH group-containing compound (a) is at least 50% by mole.

15. A precursor for lithographic printing according to claim 6 wherein the vinyl group-containing polysiloxane (b) has a weight average molecular weight of at least 30,000 and up to 100,000.

16. A precursor for lithographic printing according to claim 6 wherein molar ratio of number of the SiH groups in the SiH group-containing compound (a) to number of the vinyl groups in the vinyl group-containing polysiloxane (b) (number of the SiH groups/number of the vinyl groups) is at least 2 and up to 6.

17. A lithographic printing plate produced by the steps of exposing the precursor for lithographic printing of claim 1 according to image, and developing the exposed precursor and removing the ink repellent layer.

18. A method for producing a lithographic printing plate comprising the steps of exposing the precursor for lithographic printing of claim 1 according to image, and developing the exposed precursor and removing the ink repellent layer.

19. A method for producing a printed material comprising the steps of allowing an ink to adhere to the surface of the lithographic printing plate of claim 17, and transferring the ink to the printing substrate either directly or via a blanket.

20. A method for producing a printed material according to claim 19 further comprising the steps of irradiating the ink transferred to the printing substrate with an active energy ray.

* * * * *